(12) United States Patent
Lee et al.

(10) Patent No.: US 7,952,920 B1
(45) Date of Patent: May 31, 2011

(54) PHASE CHANGE MEMORY ARRAY CIRCUITS AND METHODS OF MANUFACTURE

(75) Inventors: Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/952,613

(22) Filed: Nov. 23, 2010

Related U.S. Application Data

(63) Continuation of application No. 12/002,121, filed on Dec. 14, 2007, now Pat. No. 7,839,672.

(60) Provisional application No. 60/870,501, filed on Dec. 18, 2006, provisional application No. 60/871,042, filed on Dec. 20, 2006.

(51) Int. Cl.
*G11C 11/00* (2006.01)

(52) U.S. Cl. .......... 365/163; 365/148

(58) Field of Classification Search .......... 365/163, 365/148
See application file for complete search history.

(56) References Cited

U.S. PATENT DOCUMENTS

| | | | |
|---|---|---|---|
| 6,314,014 B1 | 11/2001 | Lowrey et al. | |
| 7,057,923 B2 | 6/2006 | Furkay et al. | |
| 7,173,271 B2 | 2/2007 | Chang | |
| 7,223,693 B2 | 5/2007 | Choi et al. | |
| 7,227,776 B2 | 6/2007 | Cho et al. | |
| 7,232,703 B2 | 6/2007 | Morita et al. | |
| 7,539,048 B2 | 5/2009 | Farnworth | |
| 7,729,161 B2 | 6/2010 | Lung et al. | |
| 2006/0018175 A1 | 1/2006 | Liljedahl et al. | |
| 2006/0077737 A1* | 4/2006 | Ooishi | 365/203 |
| 2006/0198183 A1 | 9/2006 | Kawahara et al. | |
| 2007/0153616 A1 | 7/2007 | Kim et al. | |
| 2007/0155172 A1 | 7/2007 | Lai et al. | |
| 2007/0165455 A1* | 7/2007 | Park et al. | 365/185.01 |
| 2007/0184613 A1* | 8/2007 | Kim et al. | 365/211 |
| 2008/0025077 A1 | 1/2008 | Scheuerlein et al. | |
| 2009/0034320 A1 | 2/2009 | Ueda | |
| 2009/0067226 A1 | 3/2009 | Lankhorst et al. | |
| 2009/0237984 A1 | 9/2009 | Porter | |
| 2010/0008133 A1 | 1/2010 | Cho et al. | |
| 2010/0020595 A1 | 1/2010 | Parkinson et al. | |
| 2010/0177555 A1* | 7/2010 | Shimakawa et al. | 365/148 |
| 2011/0002154 A1* | 1/2011 | Mitani et al. | 365/148 |

* cited by examiner

*Primary Examiner* — Tuan T. Nguyen

(57) ABSTRACT

A memory comprising: a plurality of base layers including plurality of switches; a phase-change material layer; a bit line layer arranged between and coupled to the plurality of base layers and the phase-change material layer; a word line layer arranged between and coupled to the plurality of base layers and the phase-change material layer; and a voltage source layer comprising a plurality of independent voltage source segments, wherein the plurality of independent voltage source segments are in communication with the plurality of switches.

14 Claims, 21 Drawing Sheets

PHASE CHANGE MEMORY ARRAY CIRCUITS AND METHODS OF MANUFACTURE

CROSS-REFERENCE TO RELATED APPLICATIONS

This application is a continuation of U.S. application Ser. No. 12/002,121, filed on Dec. 14, 2007, which claims the benefit of U.S. Provisional Application No. 60/870,501, filed on Dec. 18, 2006 and of U.S. Provisional Application No. 60/871,042, filed on Dec. 20, 2006. The disclosures of the applications referenced above are incorporated herein by reference in their entirety.

FIELD

The present disclosure relates to electrically programmable memory arrays, and more particularly to circuits and manufacturing methods thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electrically programmable memory arrays (EPMAs) include memory cells. Each cell may include a resistive altering type material, such as a phase-change material, and have an associated HIGH or LOW state. The HIGH and LOW states are stored and associated with a logic one (1) or zero (0) data bit. Phase-change material has states that range from a fully amorphous state (less ordered state) to a fully crystalline state (more ordered state). As the phase-change material changes from the fully amorphous state to the fully crystalline state, the resistance of the phase-change material decreases.

Referring now to FIG. 1, a schematic view of an example EPMA 10 is shown and includes memory cells 12 that are arranged in rows and columns. Each row is asserted via a word line 14 and each column is asserted via a bit line 16. Each memory cell 12 includes a phase-change memory (PCM) element 18 and a switch 20. The PCM elements 18 include first and second ends 22, 24. The switch has gate, drain and source terminals 26, 28, 30. The gate terminals 26 are coupled to the word lines 14. The drain terminals 28 are coupled to the first ends 22. The source terminals 30 are coupled to ground 32. The second ends 24 are coupled to the bit lines 16.

Capacitance associated with each of the bit lines 16 varies depending upon resistive state of the unselected PCM elements 18. This variance in capacitance may be due to parasitic capacitance between the ends 22 and the drain terminals 28. Variance in the bit line capacitance can negatively affect the ability to accurately detect the state of a PCM element.

Referring now to FIGS. 2A and 2B, a cross-sectional side view and a top view of an EPMA 40 are shown. The top view shows a layout of word lines 42, bit lines 44, and PCM elements 46. The EPMA 40 includes multiple layers that are formed in three phases. The three phases are associated with the formation of base layers 50, a phase-change material layer 52 and upper metal layers 54.

During the first phase, the base layers 50 are formed in a first facility. A first insulating layer 60 is applied on a substrate layer 62. The first insulating layer 60 and the substrate layer 62 include switches 63 with corresponding gate, drain and source terminals 64, 66, 68. Contacts 70 are formed in the first insulating layer 60 for connection with the gate, drain and source terminals 64, 66, 68. The first facility has equipment that is capable of providing fine pitch geometries and thus high-density substrates. In other words, a large number of switches are formed per unit area of the substrate layer 62.

During the second phase, the base layers 50 are transported to a second facility to form the phase-change material layer 52. The transport of the base layers 50 to a second facility prevents contamination of first facility equipment due to formation of the phase-change material layer 52. The phase-change material layer 52 is formed on the first insulating layer 60. Photolithography is used to pattern the phase-change material layer 52 to create the PCM elements 46. Precise photolithography equipment is used to provide increased density of PCM elements. Photolithography equipment, in general, may have varying degrees of precision. Increased precision allows for increased memory array density, but has associated increased manufacturing costs.

During a third phase, the base layers 50 and the phase-change material layer 52 are returned to the first facility to form the upper metal layers 54. The upper metal layers 54 include a bit line layer 80 and a word line layer 82. A second insulating layer 86 is formed over the phase-change material layer 52 followed by the bit line layer 80. Electrical vias 88 are formed in the second-insulating layer 86 to provide contact to the gate and source terminals 64, 68 and the PCM elements 46. The bit line layer 80 is patterned to form bit lines 90 and electrical connections 92. The bit lines 90 are connected to the PCM elements 46, which are connected to the drain terminals 66 by the contacts 70. The electrical connections 92 are connected to the gate and source terminals 64, 68 by the contacts 70.

A third insulating layer 100 is formed over the bit line layer 80 followed by the word line layer 82. Electrical vias 102 are formed in the third insulating layer 100 to provide contact to the electrical connections 92. The word line layer 82 is also patterned to create the word lines 42.

SUMMARY

A memory array is provided and includes cells with switches and phase-change elements that are in communication with the switches. Bit lines are in communication with the cells. Word lines are in communication with the cells. Different voltage source terminals each receive a respective source voltage. The different voltage source terminals are coupled and supply current to at least one of the cells.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
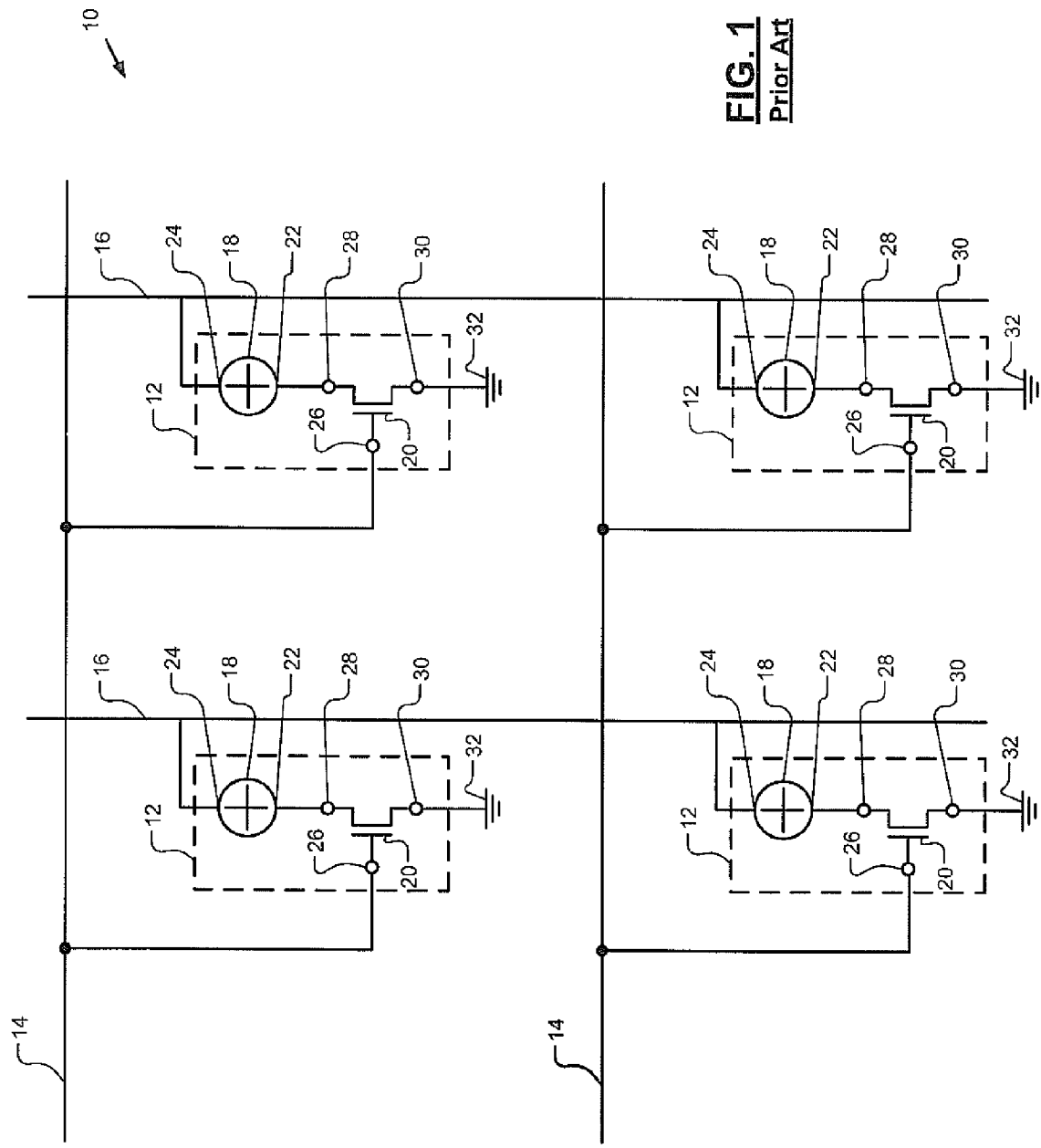
FIG. 1 is a schematic view of a traditional electrically programmable memory array (EPMA)
Figure 2A:
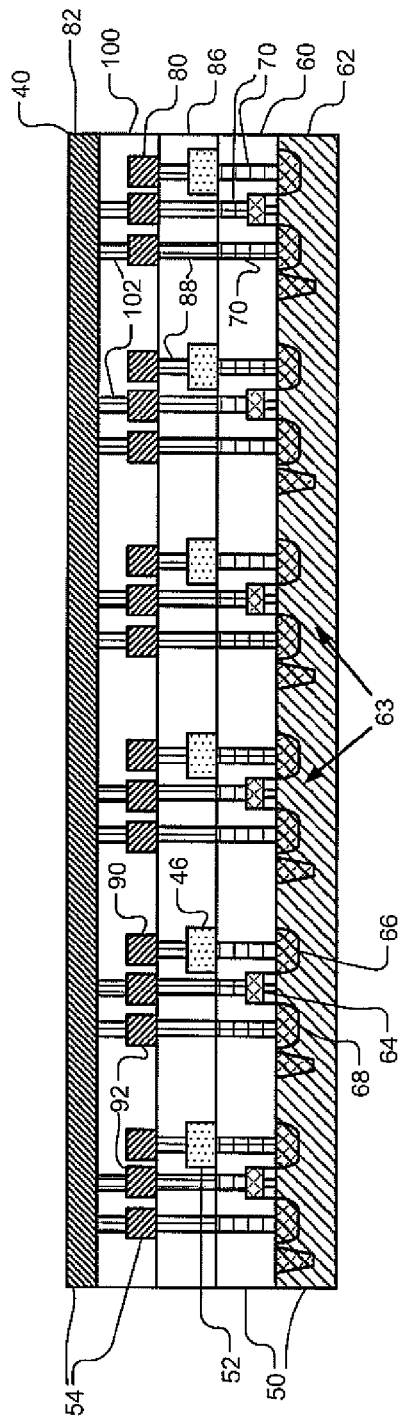
FIG. 2A is a cross-sectional side view of an EPMA.
Figure 2B:
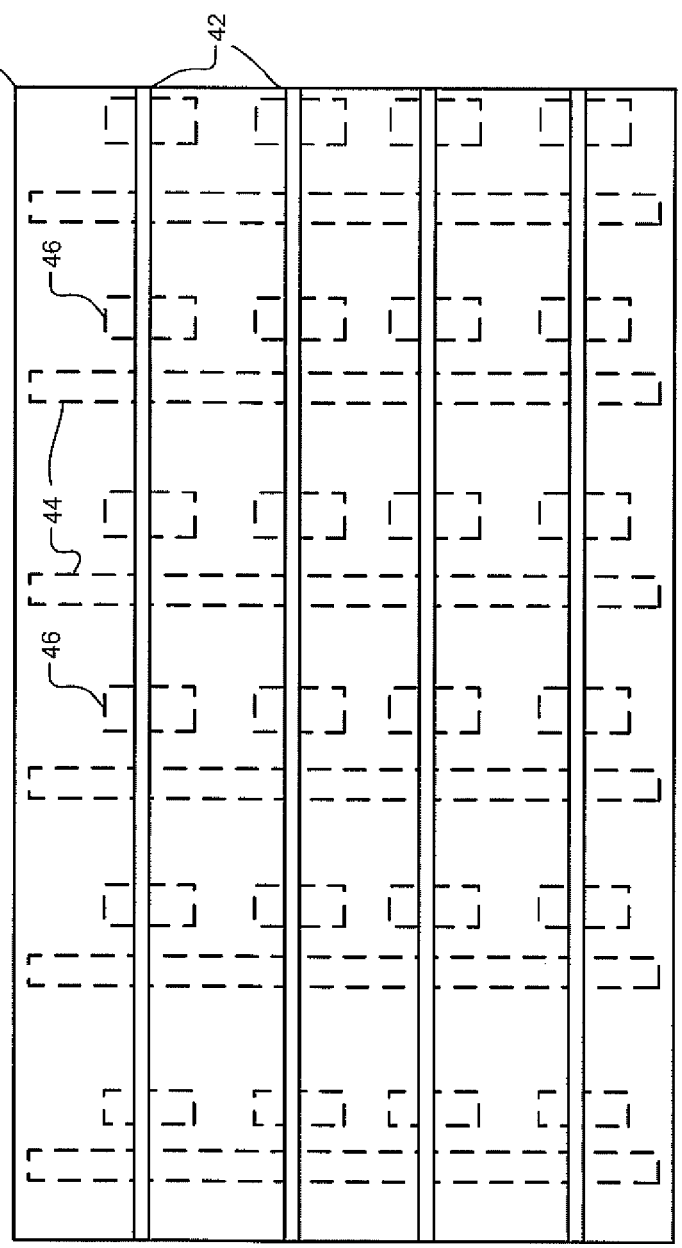
FIG. 2B is a top view of the EPMA of FIG. 2A.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Also, as used herein, the term voltage source segment refers to at least a portion of one or more metal layers of a memory. A metal layer refers to an electrically conductive layer, such as a voltage source layer, a bit line layer, a word line layer. A voltage source segment may refer to one or more voltage source terminals, lines, electrodes, or other patterned portions of one or more metal layers. A voltage source segment receives a voltage from a voltage source and provides that voltage to a memory cell.

In addition, the terms pattern and patterned refer to a created circuit pattern, which includes an electrically conductive material. Examples of an electrically conductive material are a metal or metallic material and a phase-change material. In example embodiments of the present disclosure, a pattern may have various dimensions, shapes, and any number of independent elements. A pattern may be formed from photolithography machines that have different levels of precision and/or processing complexity. A pattern may be formed to provide a dense layout of individual elements or to separate groups of elements. As described herein, different scales of patterns may be formed. A coarse scale technique, for example having separation distances of greater than or equal to approximately 0.5 micron, may be used to separate groups of elements. A fine scale technique, for example having separation distances of less than approximately 0.5 micron, may be used to provide a dense layout of individual elements. Actual separation distances may vary based on the state of patterning technology.

Furthermore, the below disclosed embodiments may apply to various memories, memory arrays, and memory circuits. The embodiments may apply to non-volatile memories, such as any suitable type of semiconductor or solid-state memory, such as flash memory (including NAND and NOR flash memory), programmable read only memory (PROM), phase change memory, magnetic RAM, multi-state memory, or other type of non-volatile memory.

Moreover, many different embodiments are described below. Features of each embodiment are not specific to a particular embodiment and may be used in or replace features of other embodiments.

Figure 3:
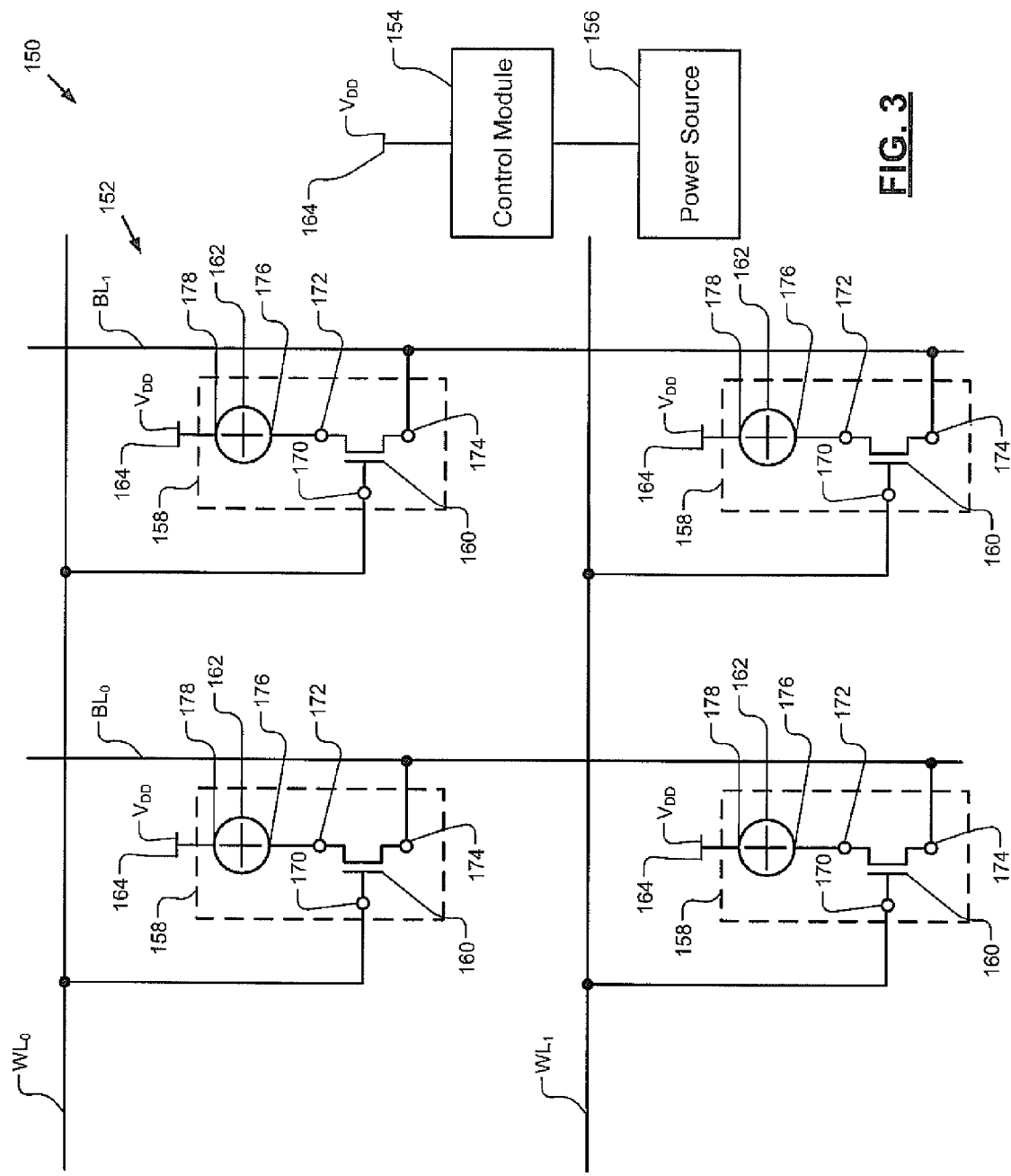
FIG. 3 is a functional block diagram and a schematic view of a memory circuit illustrating a drain side phase-change memory (PCM) element configuration with shared voltage source segments in accordance with an embodiment of the present disclosure.

Referring now to FIG. 3, a functional block diagram and a schematic view of a memory circuit 150 is shown. FIG. 3 illustrates a drain side phase-change memory (PCM) element configuration with shared voltage source segments. The memory circuit 150 includes an electrically programmable memory array (EPMA) 152, a control module 154 and a power source 156.

The EPMA 152 includes memory cells 158 that are arranged in rows and columns. The memory cells 158 are asserted via associated sets of word lines $WL_0$, $WL_1$ and bit lines $BL_0$, $BL_1$. The word lines $WL_0$, $WL_1$ extend along the rows and the bit lines $BL_0$, $BL_1$ extend along the columns.

Each memory cell 158 includes a switch 160 and a phase-change memory (PCM) element 162. The PCM elements 162 are coupled to voltage source terminals 164. The voltage source terminals 164 share a common source voltage $V_{DD}$ and thus are part of a single voltage source segment. The switches 160 may be three terminal switches, metal-oxide-semiconductor field-effect transistors (MOSFETs), bipolar junction switches (BJTs), or other switches. The PCM elements 162 may include a chalcogenide compound that has chemical elements, such as germanium (Ge), antimony (Sb), tellurium (Te), silver (Ag), indium (In), rare-earth metals, alkaline-earth metals, etc. The amounts of the chemical elements used to form the PCM elements 162 may be preselected and depend upon the application.

A bit may be stored and/or read from each of the PCM elements 162. As an example, to read from a PCM element, an associated word line is asserted, a voltage source terminal is set high, and an associated bit line is precharged low. Current flow from the voltage source terminal, to the PCM element, through the switch, and to the bit line. Because the volume of the applied current changes depending on the resistance value of the PCM element, memory contents of the PCM element can be read based on the amount of current detected.

As another example, to write data, a current is applied in a prescribed manner to change the crystalline condition of the PCM element. After applying current to increase the temperature of the PCM element above melting temperature, such as approximately 600° C., current is quickly removed. The increase in temperature and quick removal of the current changes the PCM element from a crystalline (low-resistive) state to an amorphous (high-resistive) state. In contrast, to change the PCM element from an amorphous state to a crystalline state, a predetermined amount of current is applied to the PCM element and/or the current is slowly removed. This crystallizes the PCM element. The maintenance of a resistive state provides non-volatile memory characteristics.

The switches 160 and PCM elements 162 may be arranged in different configurations, some of which are shown and described herein. The switches 160, as shown, include gate, drain, and source terminals 170, 172, 174. Should a BJT be incorporated, the switch may have base, emitter, and collector terminals. The PCM elements 162 include first and second ends 176, 178. The gate (or base) terminals 170 are coupled to the word lines $WL_0$, $WL_1$. The drain (or collector) terminals 172 are coupled to the first ends 176. The source (or emitter) terminals 174 are coupled to the bit lines $BL_0$, $BL_1$. The second ends 178 are coupled to the voltage source terminals 164.

The shared power source terminal 164 may be part of or include a voltage source segment and may have different voltage potentials depending upon the application. The shared power source terminal 164 may have a voltage potential, such as $V_{DD}$, $V_{SS}$, $V_{CC}$, $V_{EE}$, or some other voltage potential. As another example, when a BJT is used, a shared power source voltage may be $V_{CC}$.

The control module 154 receives power from the power source 156 and sets the source voltage $V_{DD}$. The control module 154 may set the source voltage $V_{DD}$ based on the number of memory cells, characteristics of each cell, arrangement and spatial location of the cells relative to each other, etc. Characteristics of each memory cell may include arrangement of elements in each cell, types of switches and/or PCM elements, etc. The control module 154 may be incorporated with the EPMA 152 on a system-on-chip (SOC) or integrated circuit (IC) or may be located separate and/or remote from the EPMA 152. The control module 154 may regulate and filter voltage provided to the memory cells.

Since the PCM elements 162 are separated from the bit lines $BL_0$, $BL_1$ by the switches 160, parasitic capacitance from the bit lines $BL_0$, $BL_1$, is independent of the states of unselected PCM elements 162. The parasitic capacitance of the unselected PCM elements 162 is isolated from the bit lines $BL_0$, $BL_1$ when the switches 160 are in an OFF state. Thus, memory cell capacitance is constant regardless of whether the associated PCM element is in a HIGH or LOW resistive state.

To prevent leakage from the switches 160 to the bit lines $BL_0$, $BL_1$, the source voltage $V_{DD}$ may be adjusted to decrease and/or eliminate current flow from the switches 160 to the bit lines $BL_0$, $BL_1$. For example, the source voltage $V_{DD}$ may be set approximately equal to the voltage of the bit lines $BL_0$, $BL_1$.

Figure 4:
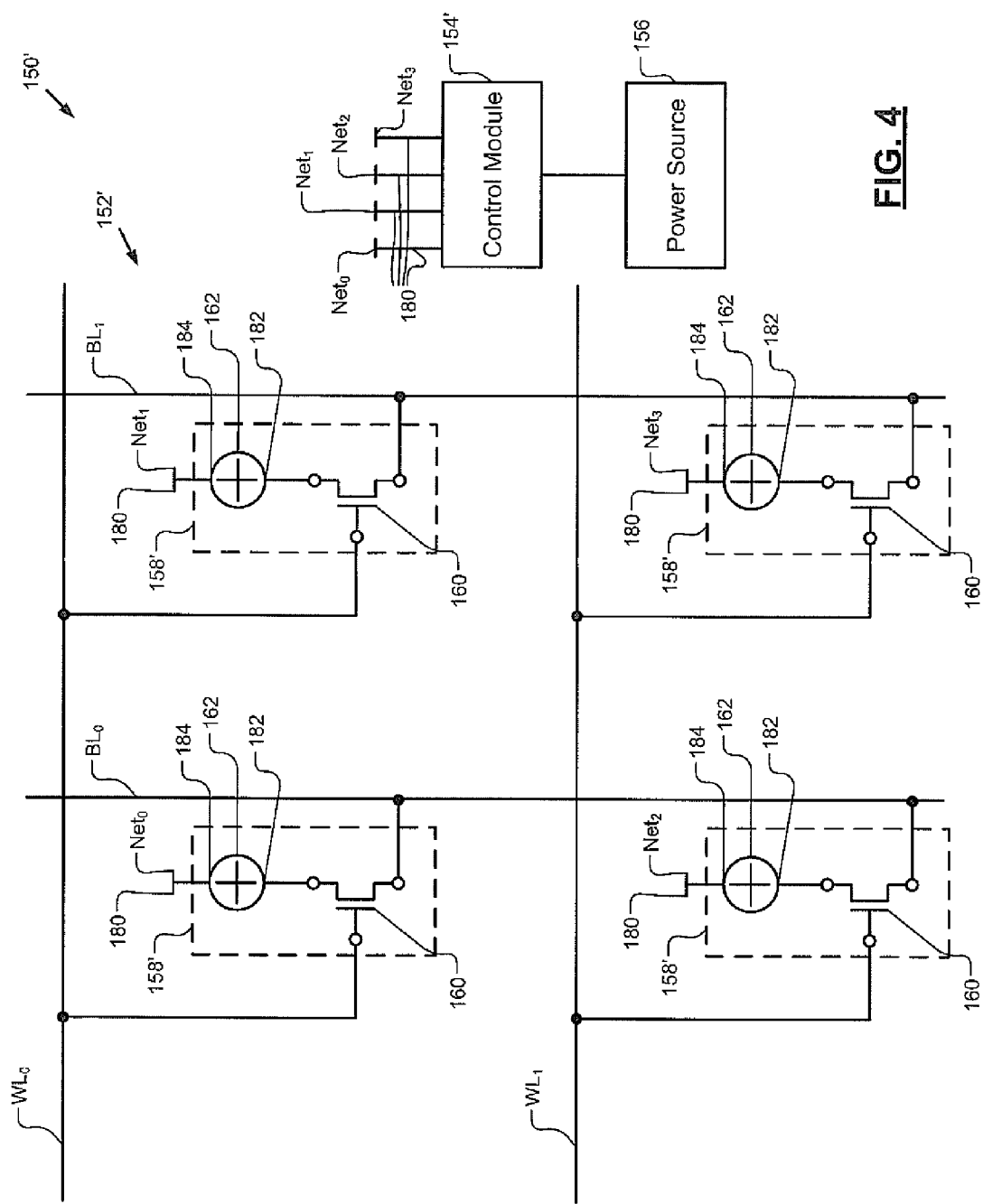
FIG. 4 is a functional block diagram and a schematic view of a memory circuit illustrating a drain side PCM element configuration with shared voltage source segments in accordance with another embodiment of the present disclosure.

Referring now to FIG. 4, a functional block diagram and a schematic view of a memory circuit 150' is shown. FIG. 4 illustrates a drain side PCM element configuration with shared voltage source segments. The memory circuit 150' includes an EPMA 152', a control module 154' and the power source 156.

The EPMA 152' includes the memory cells 158' that each has a different respective voltage source terminal 180. Each voltage source terminal 180 has a different voltage $Net_0$, $Net_1$, $Net_2$, and $Net_3$. The voltages $Net_0$, $Net_1$, $Net_2$, and $Net_3$ are set by the control module 154'. The voltages $Net_0$, $Net_1$, $Net_2$, and $Net_3$ may vary depending upon the mode of the associated memory cell. For example, a memory cell may be in a read or write mode. This allows a portion of the EPMA 152' to be written while another portion is being read. The voltages $Net_0$, $Net_1$, $Net_2$, and $Net_3$ may also vary and be set at different times depending upon the number of cells associated with each voltage source terminal, characteristics of each memory cell, arrangement and spatial location of the memory cells relative to each other, etc.

The EPMA 152', in addition to the memory cells 158', also includes the word lines $WL_0$, $WL_1$ and the bit lines $BL_0$, $BL_1$. The memory cells 158' include the switches 160 and the PCM elements 162. The PCM elements 162 include first and second ends 182, 184. The switches 160 are coupled to the first ends 182. The second ends 184 are coupled to the voltage source terminals 180.

Although, each of the voltage supply terminals 180 is shown as being associated with a different memory cell, each of the voltage supply terminals 180 may be shared by any number of memory cells. In other words, each supply voltage and associated voltage supply terminal may be associated with a group of memory cells and/or a group of switches or PCM elements. Each group of memory cells may be referred to as a sub-array. The grouping of the memory cells provides increased selection and control. Each group may have any number of memory cells. The groups may include any number of rows and columns of a memory array or portions thereof. Different group examples are shown in FIGS. 6-9.

The memory cells may be grouped such that each group has approximately the same capacitance. For example, memory cells may be grouped in rows. Each row of memory cells may have approximately the same capacitance with respect to bit lines.

Figure 5:
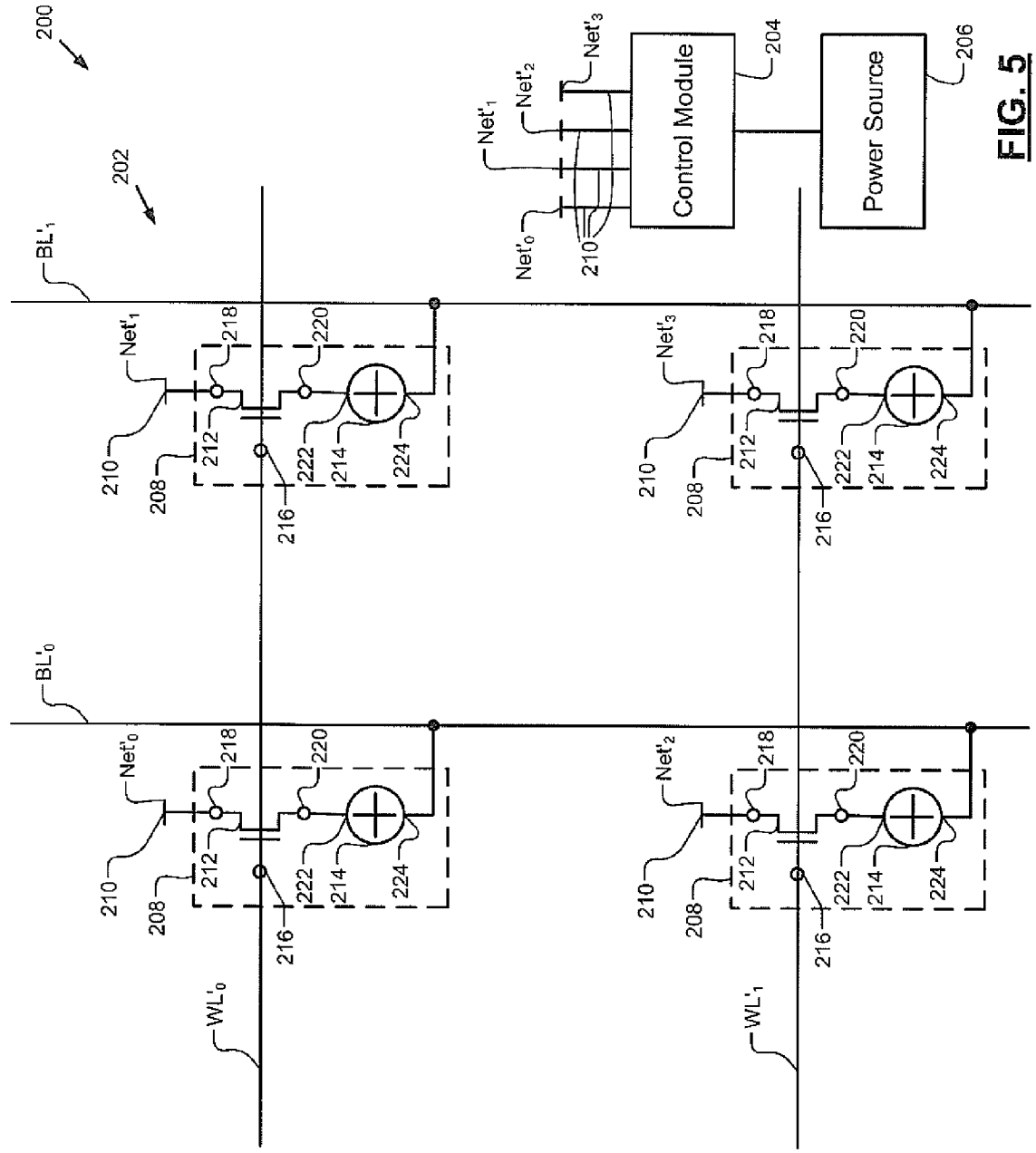
FIG. 5 is a functional block diagram and a schematic view of a memory circuit illustrating a source side PCM element configuration with shared voltage source segments in accordance with still another embodiment of the present disclosure.

Referring now to FIG. 5, a functional block diagram and a schematic view of a memory circuit 200 is shown. FIG. 5 illustrates a source side PCM element configuration with shared voltage source segments. The memory circuit 200 includes an EPMA 202, the control module 204 and a power source 206.

The EPMA 202 includes memory cells 208, word lines $WL'_0$, $WL'_1$ and bit lines $BL'_0$, $BL'_1$. Each memory cell 208 has a different respective voltage source terminal 210. Each voltage source terminal 210 has a different voltage $Net'_0$, $Net'_2$, and $Net'_3$, which may be set by the control module 204.

The memory cells 208 include switches 212 and PCM elements 214. The switches 212 are coupled between one of the voltage source terminals 210 and the PCM elements 214.

The PCM elements 214 are coupled between the switches 212 and the bit lines $BL'_0$, $BL'_1$. The switches 212, as shown, include gate, drain and source terminals 216, 218, 220. The PCM elements 214 include first and second ends 222, 224. The gate terminals 216 are coupled to the word lines $WL'_0$, $WL'_1$. The drain terminals 218 are coupled to the voltage source terminals 210. The source terminals 220 are coupled to the first ends 222. The second ends 224 are coupled to the bit lines $BL'_0$, $BL'_1$.

Figure 6:
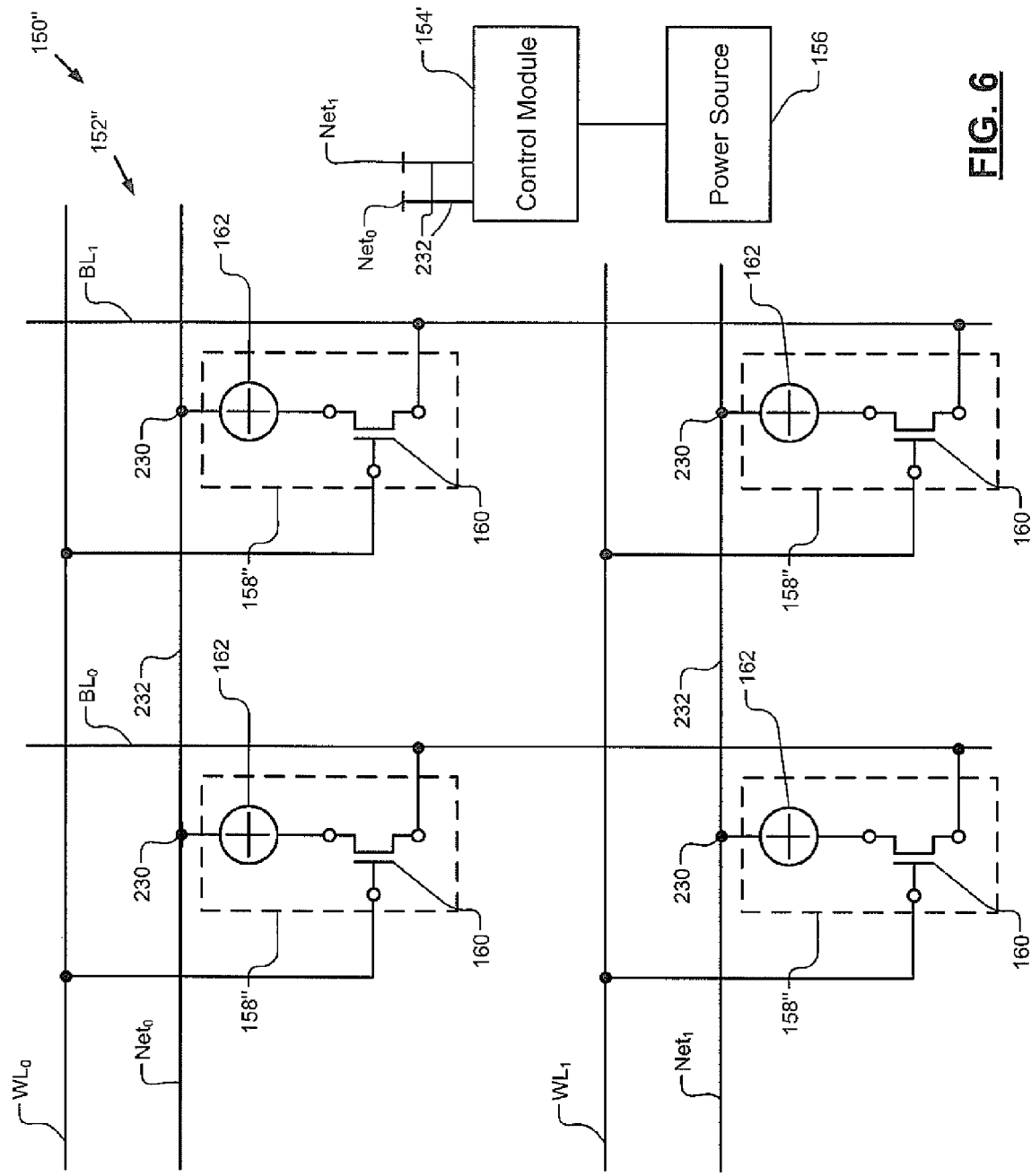
FIG. 6 is a functional block diagram and a schematic view of a memory circuit illustrating a drain side PCM element configuration with row grouping in accordance with another embodiment of the present disclosure.

Referring now to FIG. 6, a functional block diagram and a schematic view of a memory circuit 150'' illustrating a drain side PCM element configuration with row grouping is shown. The memory circuit 150'' includes an EPMA 152'', a control module 154' and the power source 156.

The EPMA 152'' includes memory cells 158'', the word lines $WL_0$, $WL_1$ and the bit lines $BL_0$, $BL_1$. The memory cells 158'' include switches 160 and the PCM elements 162. The PCM elements 162 are coupled between the switches 160 and voltage source terminals 230. The voltage source terminals 230 are coupled to shared voltage source segments 232. Each of the voltage source segments 232 extends along a row of the EPMA 152'' and is coupled to a PCM element in that row.

Figure 7:
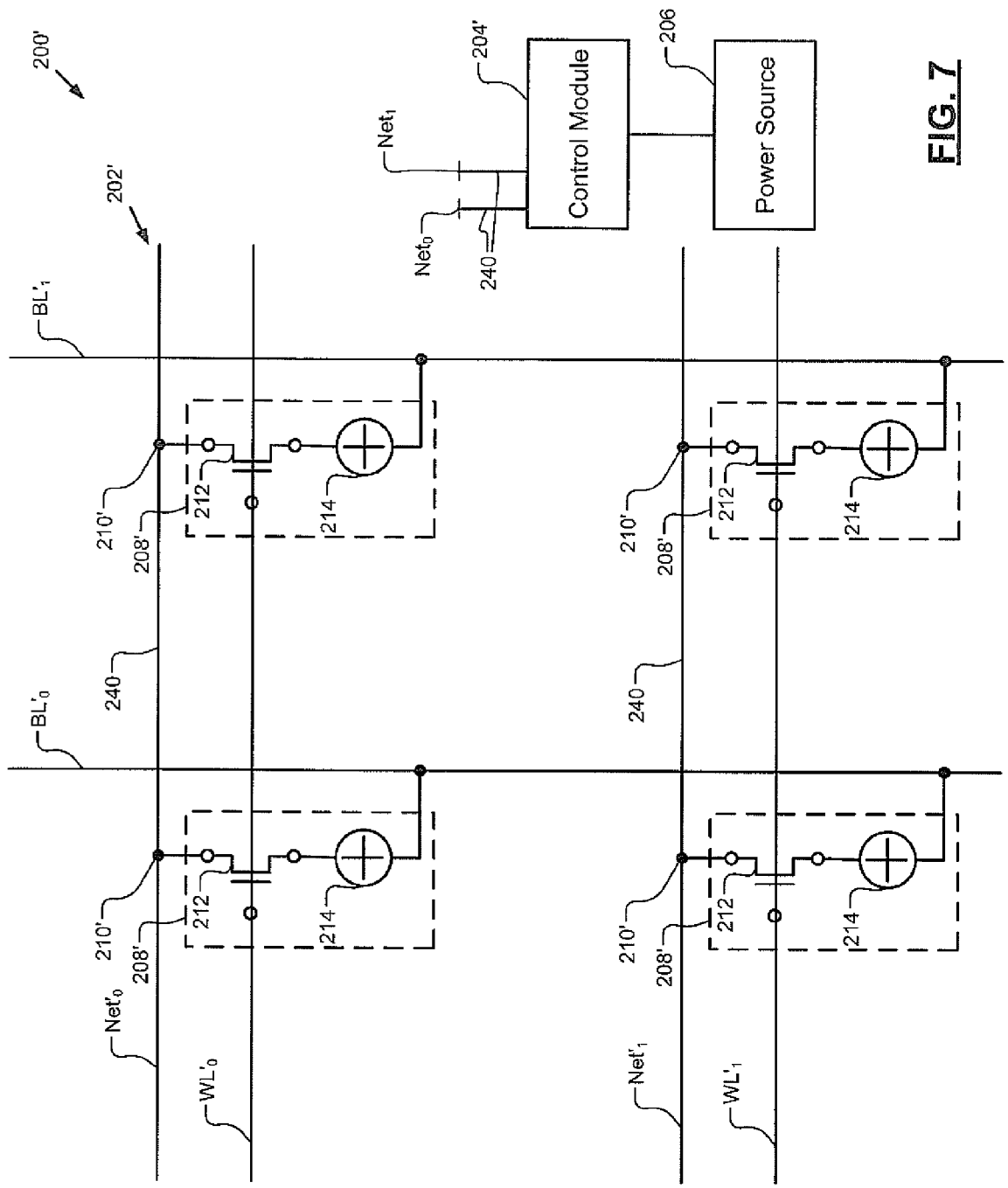
FIG. 7 is a functional block diagram and a schematic view of a memory circuit illustrating a source side PCM element configuration with row grouping in accordance with yet another embodiment of the present disclosure.

Referring now to FIG. 7, a functional block diagram and a schematic view of a memory circuit 200' illustrating a source side PCM element configuration with row grouping is shown. The memory circuit 200' includes an EPMA 202', a control module 204' and the power source 206.

The EPMA 202' includes memory cells 208', the word lines $WL'_0$, $WL'_1$ and the bit lines $BL'_0$, $BL'_1$. The memory cells 158'' include the switches 212 and the PCM elements 214. The switches 212 are coupled between voltage source terminals 210' and the PCM elements 214. The voltage source terminals 210' are coupled to shared voltage source segments 240. Each of the voltage source segments 240 extends along a row of the EPMA 202' and is coupled to a switch in that row.

As an example, during a write operation, when a row is selected (in an ON state), the associated word line is at a HIGH voltage potential. The word line may be decoded and the HIGH voltage potential may be approximately equal to a source voltage, such as $V_{DD}$. The corresponding source voltage, such as $Net_0$ or $Net_1$, is at a LOW voltage potential, such as ground.

As another example, during a read operation, a selected word line is set to a HIGH state and a selected source voltage is set to a LOW state. However, the unselected rows have word lines that are set to a LOW state. The source voltages of the unselected rows are set to voltage potentials that are approximately the same as bit line voltages. This reduces leakage current on the bit line, thereby improving the read margin. In FIGS. 6 and 7 each row of memory cells may be considered as an example group of memory cells.

Figure 8:
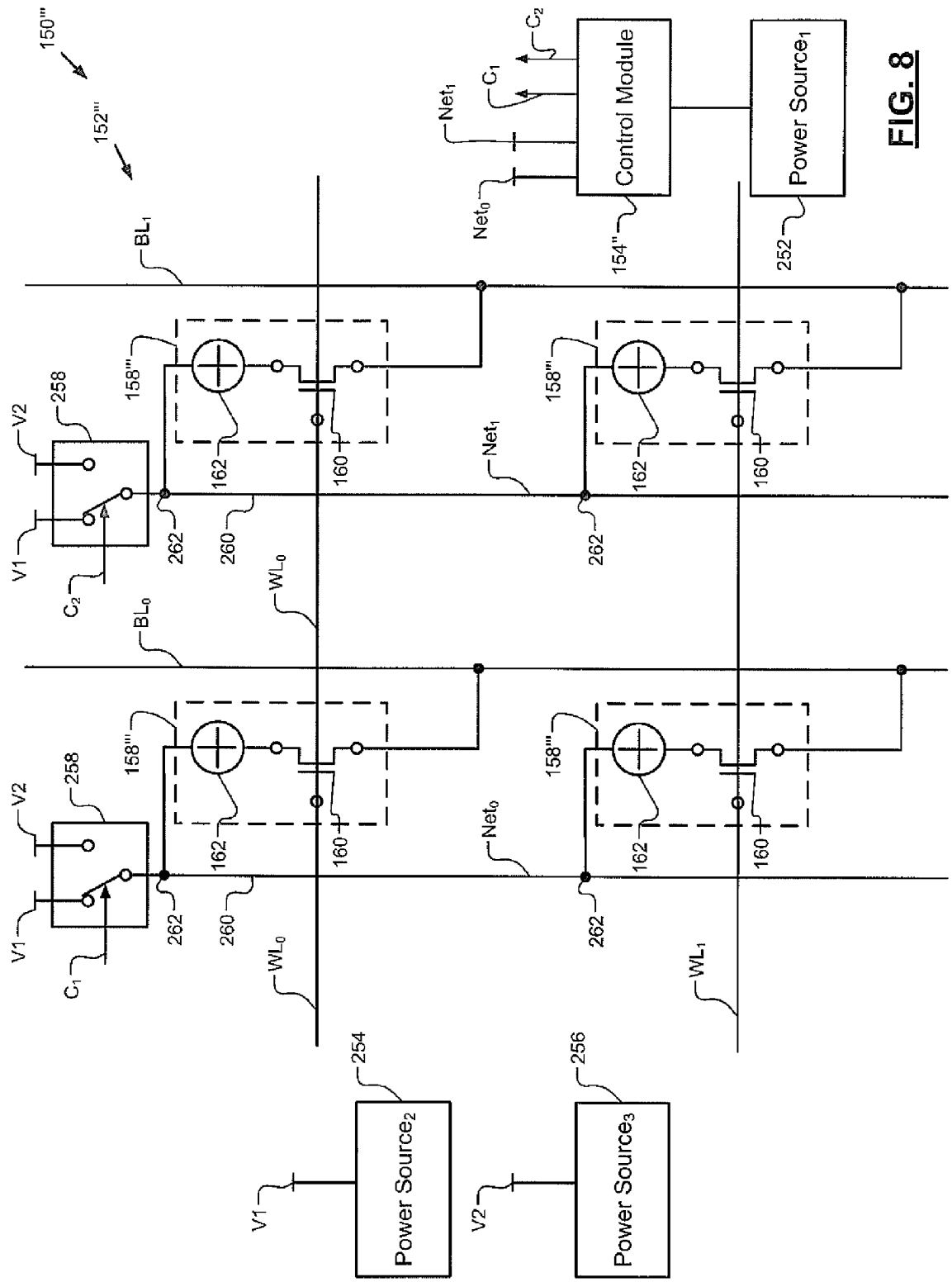
FIG. 8 is a functional block diagram and a schematic view of a memory circuit illustrating a drain side PCM element configuration with voltage source column selection in accordance with another embodiment of the present disclosure.

Referring now to FIG. 8, a functional block diagram and a schematic view of a memory circuit 150''' illustrating a drain side PCM element configuration with voltage source column selection is shown. The memory circuit 150''' includes an EPMA 152''', a control module 154'' and power sources 252, 254, 256. The memory circuit 150''' also includes power switches 258 for selection of source voltages V1, V2 applied to shared voltage source segments 260 of a memory cell column.

The EPMA 152''' includes memory cells 158''', the word lines $WL_0$, $WL_1$ and the bit lines $BL_0$, $BL_1$. The memory cells 158''' includes the switches 160 and the PCM elements 162. The PCM elements 162 are coupled between voltage source terminals 262 and the switches 160. The voltage source terminals 262 are coupled to the voltage source segments 260, which in turn are coupled to the power switches 258.

Each of the voltage source segments 260 extends along a column of the EPMA 152''' and is coupled to a PCM element in that row. The voltage source segments 260 receive a selected voltage, such as one of first and second voltages V1 and V2. The control module 154'' generates control signals $C_1$ and/or $C_2$ for control of the power switches 258. The power switches 258 may be separate from or part of the control module 154''. In the embodiment shown, the first power source 252 supplies power to the control module 154'', the second power source 254 provides voltage V1, and the third power source 256 provides voltage V2.

Figure 9:
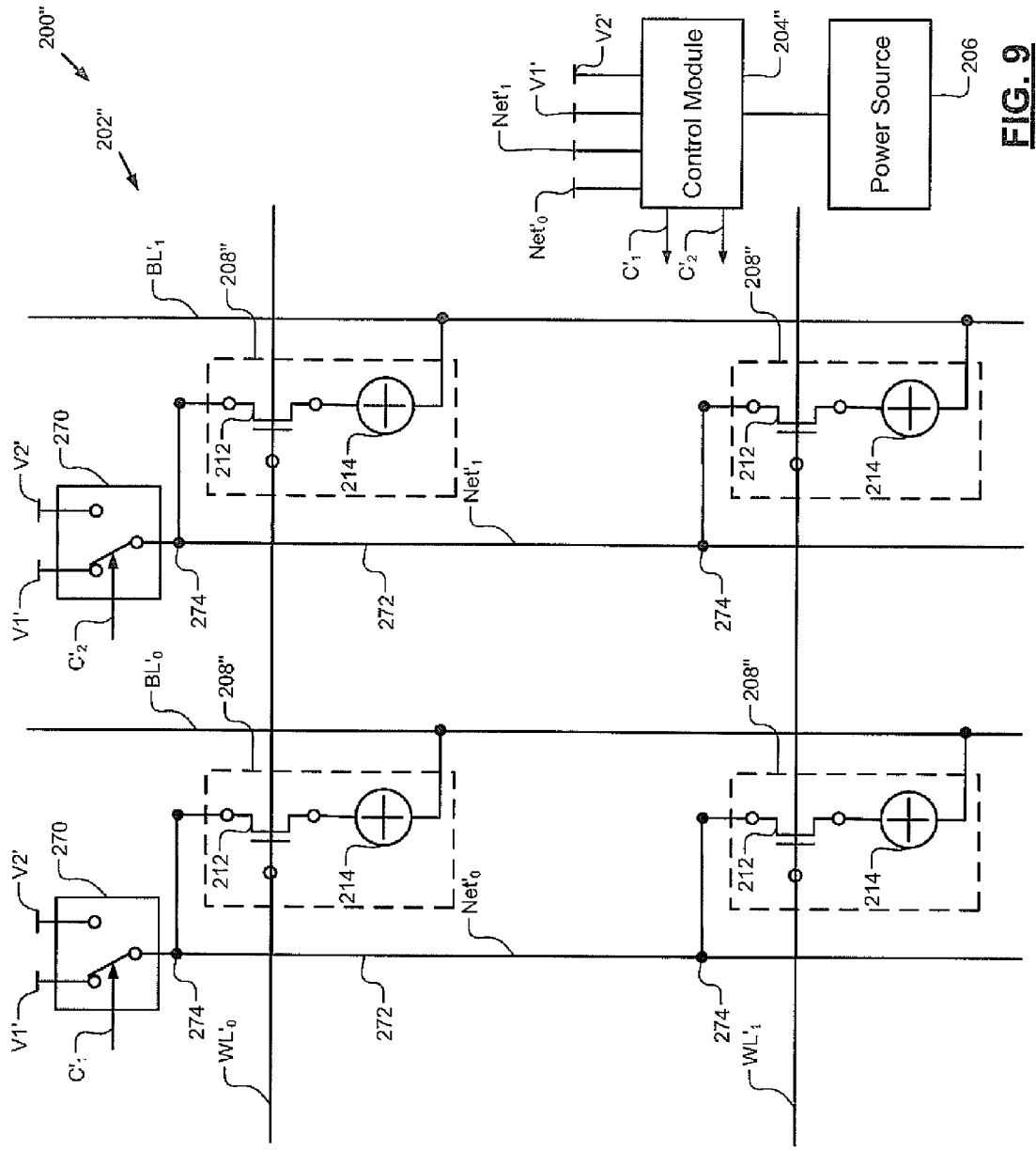
FIG. 9 is a functional block diagram and a schematic view of a memory circuit illustrating a source side PCM element configuration with voltage source column selection in accordance with another embodiment of the present disclosure.

Referring now to FIG. 9, a functional block diagram and a schematic view of a memory circuit 200'' illustrating a source side PCM element configuration with voltage source column selection is shown. The memory circuit 200'' includes an EPMA 202'', a control module 204'' and the power source 206. The memory circuit 200'' also includes power switches 270 for selection of source voltages V1' and V2' applied to shared voltage source segments 272 of a memory cell column.

The EPMA 202'' includes memory cells 208'', the word lines $WL'_0$, $WL'_1$ and the bit lines $BL'_0$, $BL'_1$. The memory cells 208'' include the switches 212 and the PCM elements 214. The switches 212 are coupled between voltage source terminals 274 and the PCM elements 214. The voltage source terminals 274 are coupled to the voltage source segments 272.

Each of the voltage source segments 272 extends along a row of the EPMA 202'' and is coupled to a memory cell switch in that row. The voltage source segments 272 receive a selected voltage, such as one of first and second voltages V1' and V2'. The control module 204'' generates control signals $C'_1$ and/or $C'_2$ for control of the power switches 270. The power switches 270 may be separate from or part of the control module 204''. In the embodiment shown, a single power source (power source 206) supplies power to the control module 204''. The control module 204'' then provides voltages V1' and V2'. The control module 204'' may regulate and filter voltage provided to the power switches 270.

FIGS. 8 and 9 illustrate that voltage source terminals may be set at various different voltages. The voltages may be set at different times and at different independent values, associated with different memory cell groupings, during operation of a memory array. In FIGS. 8 and 9 each column of memory cells may be considered as an example group of memory cells. Power switches may also be used for row grouping.

Figures 10A, 10B:
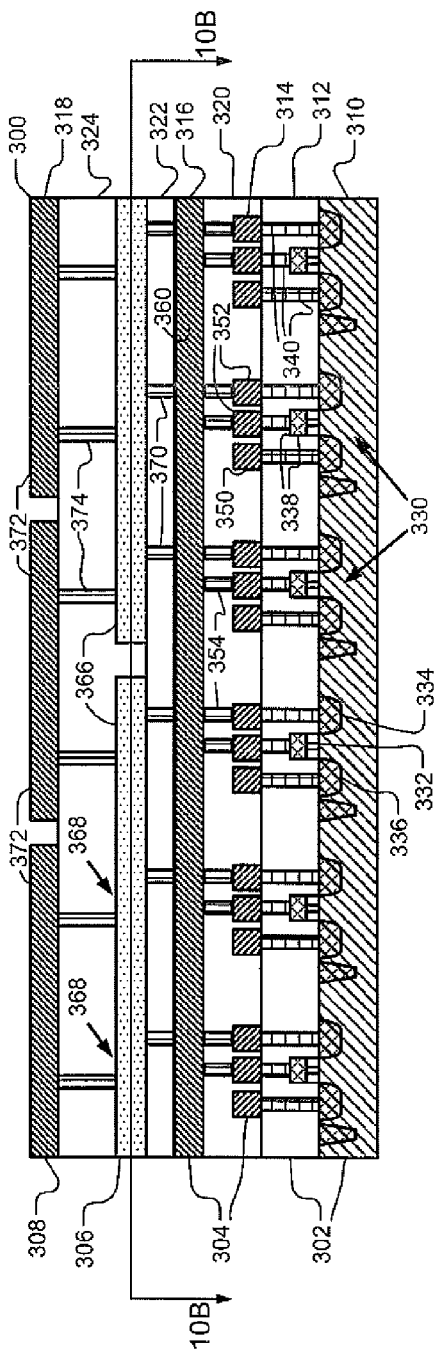
FIG. 10A is a cross-sectional side view of an EPMA in accordance with an embodiment of the present disclosure.
FIG. 10B is a sectional top view of the EPMA of FIG. 10A.

Referring now to FIGS. 10A and 10B, a cross-sectional side view and a sectional top view of an EPMA 300 is shown. The EPMA 300 of FIGS. 10A and 10B is an example of a drain side PCM element configuration. The EPMA 300 includes base layers 302, lower metal layers 304, a phase-change material layer 306, and one or more upper metal layers 308. The base layers 302 include a substrate layer 310 and a first insulating layer 312. The lower metal layers 304 include a bit line layer 314 and a word line layer 316. The upper metal layers 308 include one or more shared voltage source layers 318.

Additional insulating layers are also included. A second insulating layer 320 is coupled between the bit line layer 314 and the word line layer 316. A third insulating layer 322 is coupled between the word line layer 316 and the phase-change material layer 306. A fourth insulating layer 324 is coupled between the phase-change material layer 306 and the upper metal layers 308. Still further insulating layers may be included between voltage source layers. The base layers 302, the lower metal layers 304, the phase-change material layer 306, the upper metal layers 308, and the insulating layers 320, 322, 324 may include electrical connections, such as contacts, vias, pads, electrodes, segments, lines, or other conductive elements for electrical connections between layers of the EPMA 300 and/or for electrical connections to devices external to the EPMA 300.

The base layers 302 include switches 330, which may each include three terminals, such as a gate, a drain and a source terminal 332, 334, 336. The drain and source terminals 334, 336 are formed in the substrate layer 310 and the gate terminals 332 are formed on the substrate layer 310. Upper and side surfaces 338 of the gate terminals 332 are encapsulated by the first insulating layer 312. The first insulating layer 312 also includes contacts 340 that couple the gate, drain and source terminals 332, 334, 336 to electrical connections of the bit line layer 314 and/or vias 354 of the second insulating layer 320.

Figure 12:
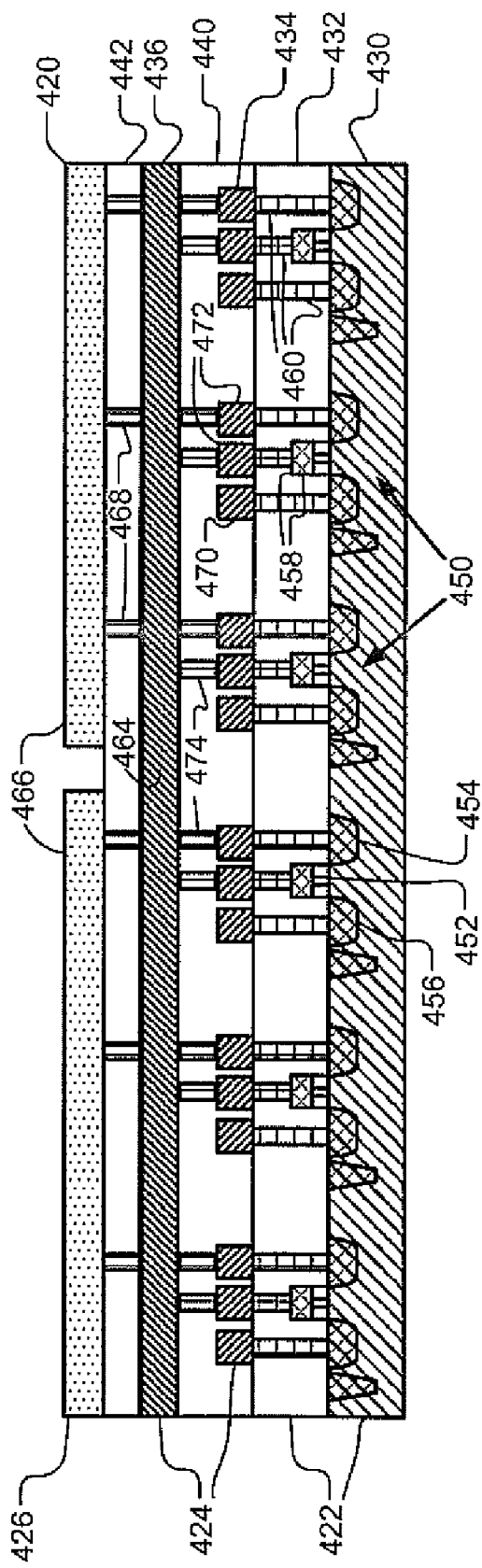
FIG. 12 is a cross-sectional side view of an EPMA in accordance with another embodiment of the present disclosure.

The lower metal layers 304 may be patterned and include electrical connections. The electrical connections of the bit line layer 314 include the bit lines 350 and may include other conductive elements 352. The bit lines 350 are connected to the source terminals 336. The conductive elements 352 couple the contacts 340 to the vias 354. The contacts 340 may be associated with the gate and drain terminals 332, 334, as shown. In another example embodiment, the bit line layer 314 does not include the conductive elements 352. When the conductive elements 352 are not incorporated, the vias 354 may be extended to connect directly to the contacts 340. This eliminates patterning to form the conductive elements 352. An example of extended vias is shown in FIG. 12.

The electrical connections of the word line layer 316 may include word lines 360 and other conductive elements. The word lines 360 are connected to the contacts 340 that are associated with the gate terminals 332 by electrical connections and/or vias of the bit line layer 314 and the second insulating layer 320. The conductive elements of the word line layer 316 may be used to couple the drain terminals 334 to the phase-change material layer 306.

The phase-change material layer 306 may include a single unified sheet of chalcogenide material that extends across the EPMA 300. In one example embodiment, the phase-change material layer 306 is divided and/or patterned into independent regional sections 366. Each regional section 366 is associated with a group of PCM elements. The PCM elements may be localized portions 368 of the regional sections 366. The localized portions 368 may be programmed between different detectable states. Formation of the regional sections 366 does not require high density patterning and thus may be performed using coarse patterning techniques and equipment. Grouping of PCM elements provides increased selection and control of memory cells. The grouping also relieves stress and/or prevents cracking and damage of the EPMA 300 due to the large cross-sectional area of the phase-change material layer 306. The phase-change material layer 306 is connected to the word lines 360 by vias 370 in the third insulating layer 322.

Each upper metal layer 308 may include a single unified metallic film that extends across the EPMA 300. In one embodiment, each upper metal layer 308 is divided and/or patterned into independent voltage source segments 372. Each of the voltage source segments 372 is associated with one or more of the regional sections 366 and a group of memory cells and may be of various shapes and sizes. In one embodiment, the voltage source segments 372 are along a row or a column, but not both. The regional sections 366 may be associated with one or more voltage source segments. The regional sections 366 are connected to the voltage source segments 372 by vias 374 in the fourth insulating layer 324.

Figure 11:
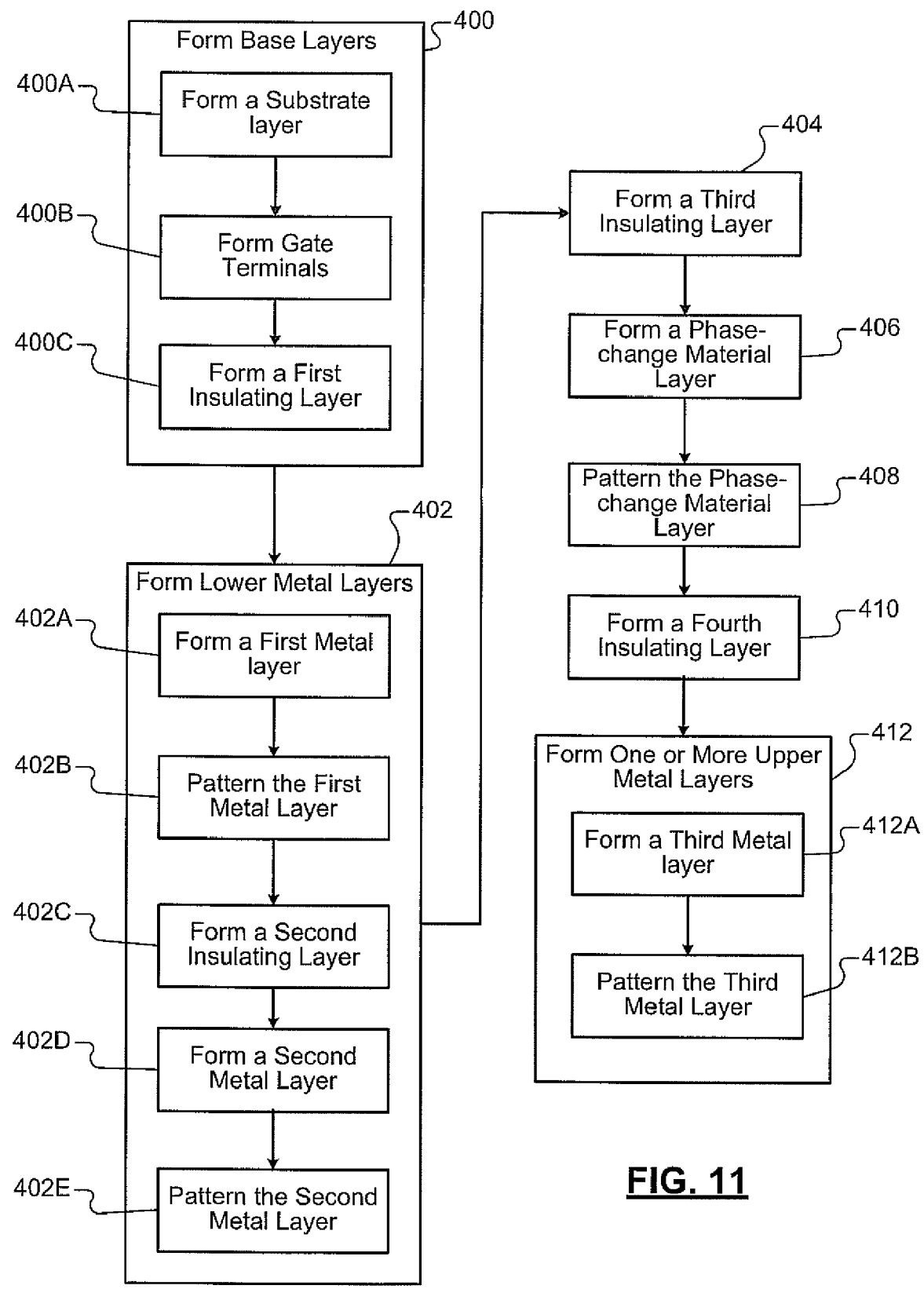
FIG. 11 is a flow diagram illustrating a method of manufacturing an EPMA in accordance with an embodiment of the present disclosure.

Referring now to FIG. 11, a flow diagram illustrating a method of manufacturing an EPMA is shown. Although the following steps are primarily described with respect to the embodiments of FIGS. 10A and 10B, the steps may be easily modified to apply to other embodiments of the present invention. For example, the steps may be modified to apply to the embodiments of FIGS. 12-15.

In step 400, base layers, such as the base layers 302, are formed. In step 400A, a substrate layer is formed, which may include diffusion to form drain and source terminals of a switch. In step 400B, gate terminals, such as the gate terminals 332, are formed on the substrate layer. In step 400C, a first insulating layer is formed. The first insulating layer, as well as other formed insulating layers may include a nonconductive insulating film, such as a silicon dioxide.

In step 402, lower metal layers, such as the lower metal layers 304, are formed. In step 402A, a first metal layer is formed on the base layers. The first metal layer may be a bit line or word line layer. In step 402B, the first metal layer is patterned. Photolithography may be used to pattern the first metal layer. The patterning results in a first set of conductive lines. The conductive lines may be bit lines or word lines.

In step 402C, a second insulating layer, such as the second insulating layer 320, is formed on the first metal layer. In step 402D, a second metal layer is formed on the first metal layer and directly on the second insulating layer. The second metal layer may be a bit line or a word line layer. When the first metal layer is a bit line layer, the second metal layer is a word line layer and vice versa. In step 402E, the second metal layer is patterned to form a second set of conductive lines. The second set of conductive lines may be bit lines or word lines. Photolithography may again be used to perform the patterning.

In step 404, a third insulating layer, such as the third insulating layer 322, is formed on the second metal layer. The base layers, the lower metal layers, and any associated electrical connections may be formed at a first facility or location that has fine pitch equipment that is designed for high density production. The electrical connections may include, for example, the contacts 340, the conductive elements 352 and the vias of the second and third insulating layers 320, 322.

In step 406, one or more phase-change material layers, such as the phase-change material layer 306, are formed on the second metal layer and directly on the third insulating layer. The phase-change material layers, other subsequently formed layers, such as upper metal layers, and any associated electrical connections may be formed at a second facility or location. The second location may have coarse pitch (low cost) equipment. Formation of the phase-change material layers and the upper metal layers at a separate location eliminates risk of contaminating the fine pitch (higher cost) equipment with chalcogenide material.

In step 408, the phase-change material layer may be patterned to form sections, such as the regional sections 366. The phase-change material layer may be a unified layer or may be divided into sections. The sections may have any number of localized portions that each serve as phase-change elements. Patterning chalcogenide or similar material for a memory array is significantly simplified through use of a three terminal switch and connection of a phase-change layer (PCM elements) as above described.

In step 410, a fourth insulating layer, such as the fourth insulating layer 324, may be formed on the phase-change material layer.

In step 412, one or more upper metal layers may be formed. In step 412A, a third metal layer, such as the voltage source layer 318, may be formed on the phase-change material layer and directly on the fourth insulating layer. In step 412B, the third metal layer is patterned to form voltage source segments that are independent of each other. The voltage source segments may be coupled to one or more rows and columns of the memory cells, such as to switches or PCM elements. The substrate layer, the lower metal layers, and the upper metal layers may include silicon, aluminum, copper, tungsten or other conductive materials.

The above-described metal layers and phase-change material layer may be formed through known sputtering or other application techniques. The above-described steps may include the formation of electrical connections, such as contacts, vias, pads, conductive element, electrodes, etc., for coupling to and/or between the switches and PCM elements. The above-described steps may also include the formation of electrical connections between the switches and/or the PCM elements and the word lines, the bit lines, localized portions, and the voltage source segments. Examples of the electrical connections are shown in FIGS. 3-10. Additional layers, such as protective layers may also be incorporated.

The above-described steps are meant to be illustrative examples; the steps may be performed sequentially, synchronously, simultaneously, continuously, during overlapping time periods or in a different order depending upon the application.

The fabrication steps of the above-disclosed method are less complex than traditional fabrication techniques. Higher cost equipment for formation of a chalcogenide layer is no longer necessary with the above-disclosed method.

Referring now to FIG. 12, a cross-sectional side view of an EPMA 420 is shown. The EPMA 420 is an example of a drain side PCM element configuration. The EPMA 420 includes base layers 422, lower metal layers 424, and a phase-change material layer 426. The EPMA 420 does not include upper metal layers and thus does not require fabrication of upper metal layers and associated insulating layers. The base layers 422 include a substrate layer 430 and a first insulating layer 432. The lower metal layers 424 include a bit line layer 434 and a word line layer 436.

Additional insulating layers are also included. A second insulating layer 440 is coupled between the bit line layer 434 and the word line layer 436. A third insulating layer 442 is coupled between the word line layer 436 and the phase-change material layer 426. Still further insulating layers may be included between voltage source layers. The base layers 422, the lower metal layers 424, the phase-change material layer 426, and the insulating layers 440, 442 may include electrical connections, such as contacts, vias, pads, electrodes, segments, lines, or other conductive elements for electrical connections between layers of the EPMA 420 and/or for electrical connections to devices external to the EPMA 420.

The base layers 422 include switches 450, which may each include three terminals, such as a gate, a drain and a source terminal 452, 454, 456. The drain and source terminals 454, 456 are formed in the substrate layer 430 and the gate terminals 452 are formed on the substrate layer 430. Upper and side surfaces 458 of the gate terminals 452 are encapsulated by the first insulating layer 432. The first insulating layer 432 also includes contacts 460 that couple the gate, drain and source terminals 452, 454, 456 to electrical connections of the bit line layer 434 and/or vias of the second insulating layer 320.

The lower metal layers 424 may be patterned and include electrical connections. The electrical connections of the bit line layer 434 include the bit lines 470 and may include other conductive elements 472. The bit lines 470 are connected to the source terminals 456. The conductive elements 472 couple contacts of the first insulating layer 432 to vias 474 of the second insulating layer 440.

The electrical connections of the word line layer 436 may include word lines 464 and other conductive elements. The word lines 464 are connected to the contacts of the first insulating layer 432 associated with the gate terminals 452 by electrical connections and/or vias of the bit line layer 434 and the second insulating layer 440. The conductive elements of the word line layer 436 may be used to couple the drain terminals 454 to the phase-change material layer 426.

The phase-change material layer 426 may directly receive one or more source voltages. The source voltages are received through a lower metal layer, and an insulating layer below the phase-change material layer 426 (between the substrate layer and the phase-change material layer 426) or directly from an external device. The source voltages are not received from a layer above the phase-change material layer 426, such as an upper metal layer. The phase-change material layer 426 serves at least dual purposes. The phase-change material layer 426 provides localized portions for storage of data and receives source voltages as a conductive layer for corresponding memory cells. The phase-change material layer 426 may include a single unified sheet of chalcogenide material that extends across the EPMA 420. In one example embodiment, the phase-change material layer 426 is divided and/or patterned into independent regional sections 466. Each regional section 466 is associated with a group of PCM elements. The PCM elements may be localized portions of the regional sections 466. The phase-change material layer 426 is connected to the word line layer 436 by vias 468 in the third insulating layer 442.

Figure 14:
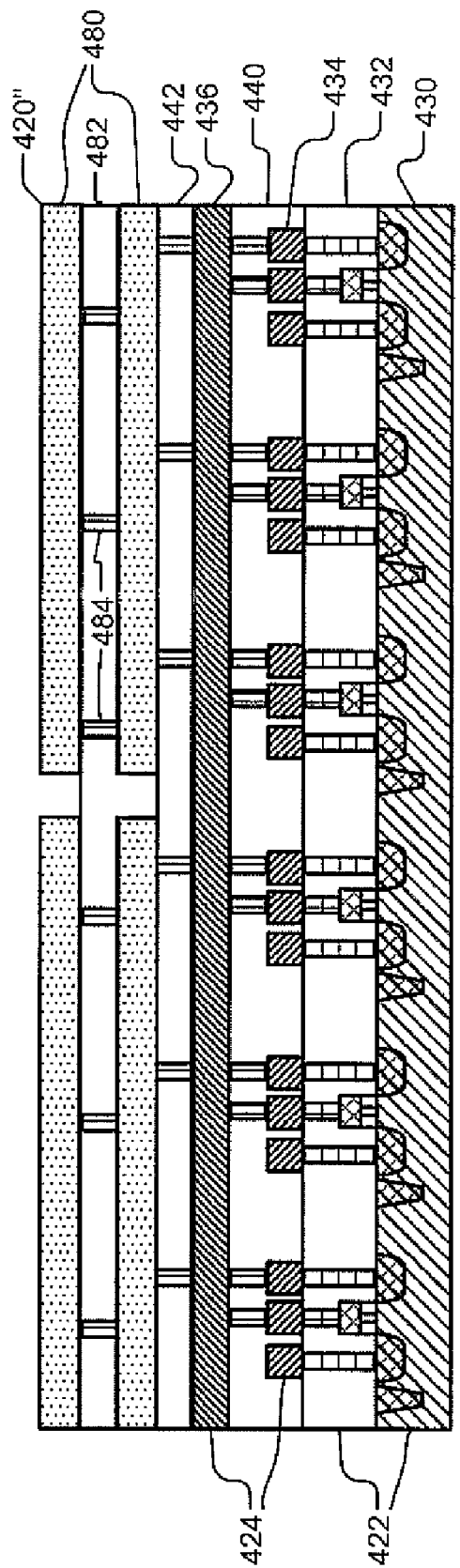
FIG. 14 is a cross-sectional side view of an EPMA in accordance with yet another embodiment of the present disclosure.

The thickness of the phase-change material layer 426 may be increased to decrease electrical resistance and improve electrical conductance for reception of source voltages. As another option, more than one phase-change material layer may be used, as shown in FIG. 14, to decrease electrical resistance.

Figure 13:
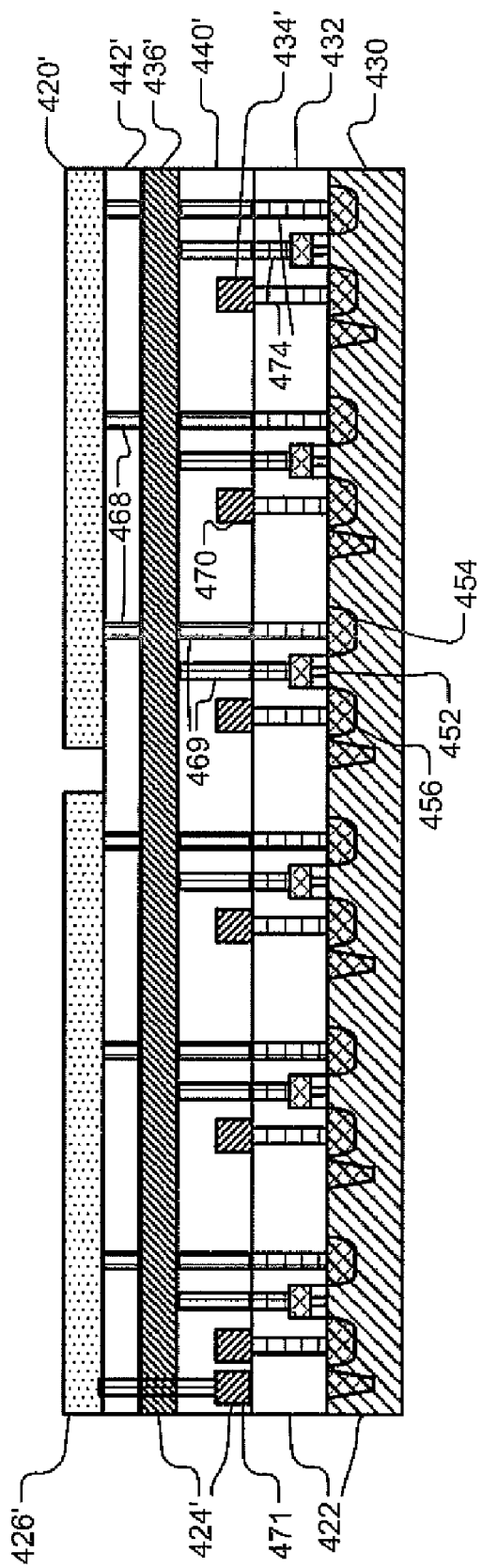
FIG. 13 is a cross-sectional side view of an EPMA in accordance with still another embodiment of the present disclosure.

Referring now to FIG. 13, a cross-sectional side view of an EPMA 420' is shown. The EPMA 420' is an example of a drain side PCM element configuration. The EPMA 420' includes base layers 422, lower metal layers 424', and a phase-change material layer 426'. The EPMA 420' does not include upper metal layers. The base layers 422 include a substrate layer 430 and a first insulating layer 432. The lower metal layers 424' include a bit line layer 434' and a word line layer 436'.

Additional insulating layers are also included. A second insulating layer 440' is coupled between the bit line layer 434' and the word line layer 436'. A third insulating layer 442' is coupled between the word line layer 436' and the phase-change material layer 426'. Still further insulating layers may be included between voltage source layers. The base layers 422, the lower metal layers 424', the phase-change material layer 426', and the insulating layers 440', 442' may include electrical connections, such as contacts, vias, pads, electrodes, segments, lines, or other conductive elements for electrical connections between layers of the EPMA 420' and/or for electrical connections to devices external to the EPMA 420'. As shown, the second insulating layer 442' has vias 469 that extend between the first insulating layer 432 and the word line layer 436'.

The lower metal layers 424' may be patterned and include lower metal layer electrical connections. The electrical, connections of the bit line layer 434' include the bit lines 470', one or more voltage source connections 471, and may include other conductive elements. The bit lines 470 are connected to the source terminals 456. The voltage source connections 471 receive source voltages from one or more voltage sources or control modules that are external to the EPMA 420'. The vias 469 are connected to contacts 474 of the first insulating layer 432.

The electrical connections of the word line layer 436' may include word lines 464 and other conductive elements. The word lines 464 are connected to the contacts of the first insulating layer 432 associated with the gate terminals 452 by electrical connections and/or vias of the bit line layer 434 and the second insulating layer 440. The conductive elements of the word line layer 436 may be used to couple the drain terminals 454 to the phase-change material layer 426. The word line layer 436' may include voltage source connections for reception of one or more source voltages. Other metal layers may also be coupled between the substrate layer 430 and the phase-change material layer 426' for reception of source voltages. Also, electrical connections may be incorporated into the insulating layers 432, 440', 442' for reception of source voltages for distribution to memory cells of the EPMA 420'.

Although a voltage source connection is shown as part of the bit line layer 434', voltage source connections, referred to as insulating layer connections, may be included in any of the herein described insulating layers. The insulating layer connections may receive source voltages and be, for example also coupled to the switches or phase-change material layer of a memory array by vias.

Referring now to FIG. 14, a cross-sectional side view of an EPMA 420" is shown. The EPMA 420" is an example of a drain side PCM element configuration. The EPMA 420" includes base layers 422, lower metal layers 424, and phase-change material layers 480. The EPMA 420 does not include upper metal layers. The base layers 422 include a substrate layer 430 and a first insulating layer 432. The lower metal layers 424 include a bit line layer 434 and a word line layer 436.

Additional insulating layers are also included. A second insulating layer 440 is coupled between the bit line layer 434 and the word line layer 436. A third insulating layer 442 is coupled between the word line layer 436 and the phase-change material layer 426. Still further insulating layers may be included between voltage source layers. The base layers 422, the lower metal layers 424, the phase-change material layers 480, and the insulating layers 440, 442 may include electrical connections, such as contacts, vias, pads, electrodes, segments, lines, or other conductive elements for electrical connections between layers of the EPMA 420" and/or for electrical connections to devices external to the EPMA 420".

The phase-change material layers 480 may directly receive one or more source voltages. The phase-change material layers 480 serve at least dual purposes. The phase-change material layers 480 provide localized portions for storage of data and receive source voltages for corresponding memory cells. The phase-change material layers 480 may each include a single unified sheet of chalcogenide material that extends across the EPMA 420" or may be divided into regional sections. One or more insulating layers 482 are coupled between the phase-change material layers 480. Electrical connections, such as vias 484 of the insulating layers 482, couple the phase-change material layers 480.

The above-described electrical connections that receive source voltages may be incorporated into layers that have surface areas that extend beyond the surface areas of a memory array. This allows for attachment to the electrical connections. As an example, FIG. 15 illustrates a memory package that includes a phase-change material layer that has a surface area that extends beyond a perimeter of a memory array for the inclusion of voltage source input pads.

Figure 15:
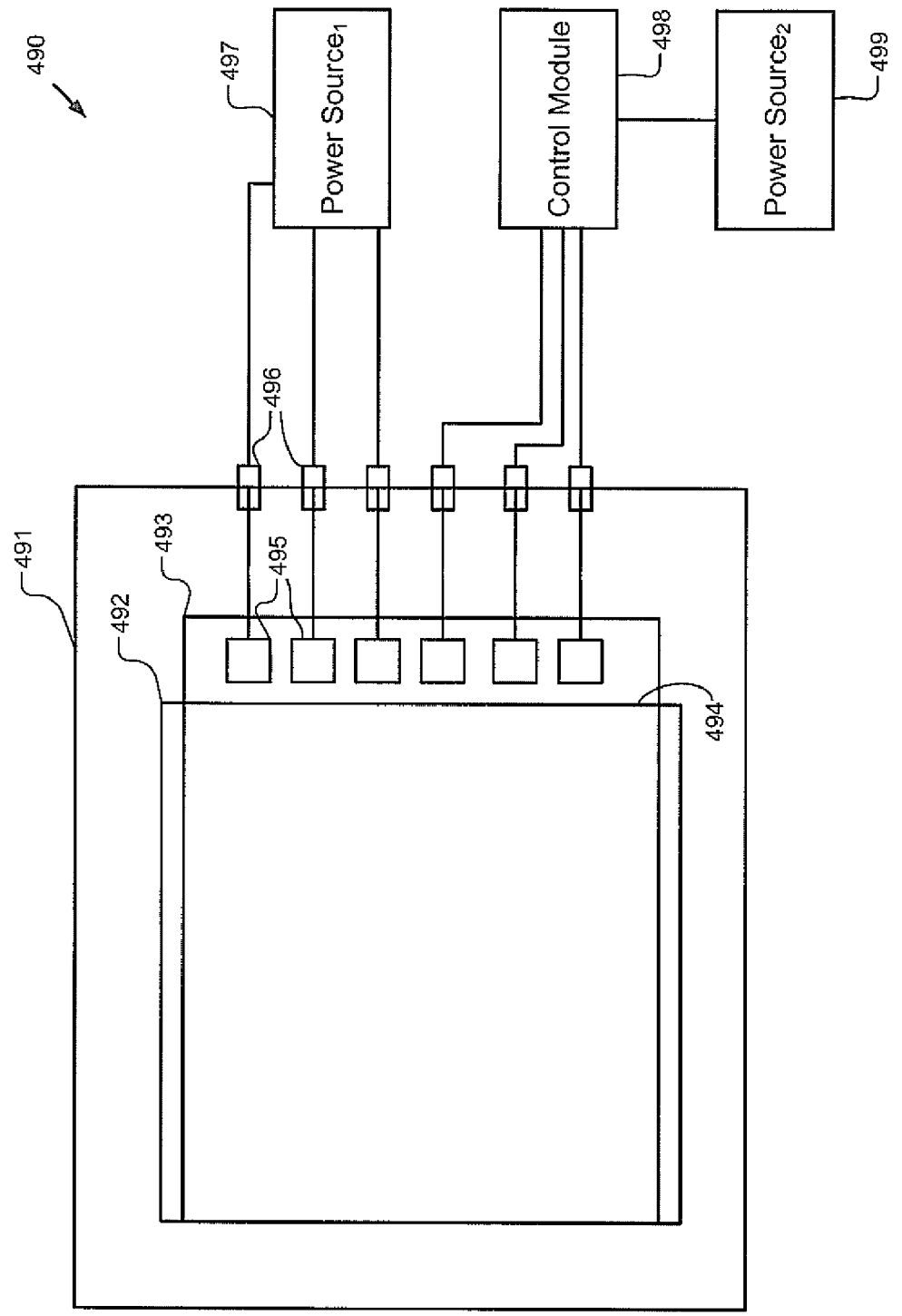
FIG. 15 is a top view of a memory circuit in accordance with another embodiment of the present disclosure.

Referring now to FIG. 15, a top view of a memory circuit 490 is shown. The memory circuit 490 includes an IC package 491 with an EPMA 492. The EPMA 492 has a phase-change material layer 493 that extends beyond the perimeter 494 of the memory array and includes voltage source input pads 495. The voltage source input pads 495 are coupled to input pins 496. The input pins 496 are coupled to a first power source 497 and a control module 498. The control module 498 is coupled to a second power source 499.

The above-described embodiments provide memory arrays with increased yield and associated methods of manufacturing with decreased processing steps. The term yield refers to the number of non-defective memory arrays or associated parts per a given batch of parts produced.

Figure 16:
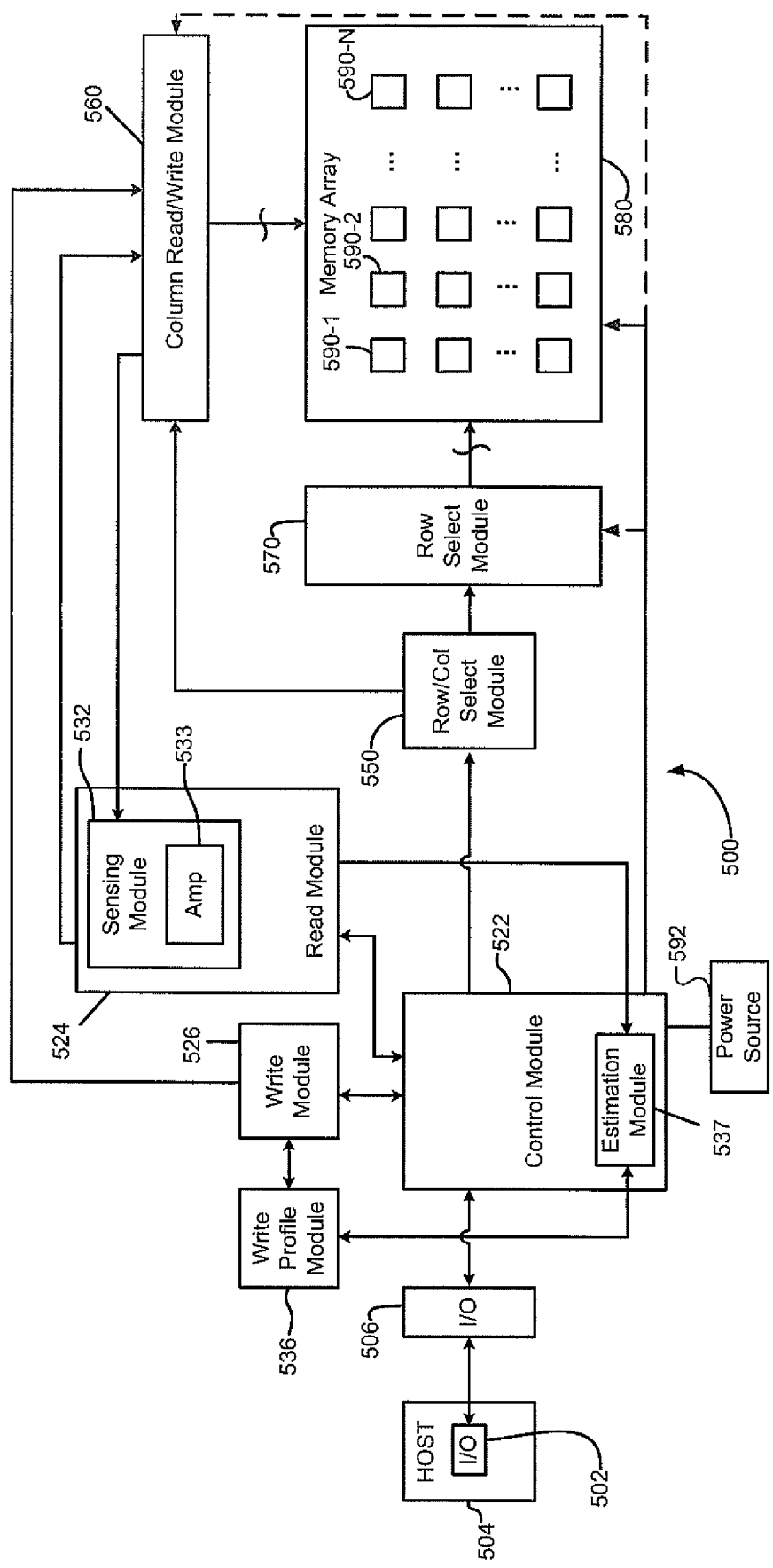
FIG. 16 is a functional block diagram of an exemplary memory module in accordance with an embodiment of the present disclosure.

Referring now to FIG. 16, a functional block diagram of an exemplary memory module is shown. The memory module 500 is capable of being read from and written to by an input/output (I/O) module 502 of a host device 504 through a memory I/O module 506. The memory module 500 includes a memory array 580 with memory cells 590-1, 590-2, . . . , 590-N (collectively 590). Each of the memory cells 590 store data and may be programmable to different resistance states.

A control module 522 receives control signals from the host device 504 and controls a read module 524, a write module 526, and a row/column select module 550. The control module 522 controls source voltage and power supplied to the memory cells 590 from one or more power sources 592. The control module 522 may control source voltage selection by switches, for example, in the row and column modules 560, 570. Further, the control module 522 includes an estimation module 537, as will be described below. The row/column select module 550 outputs select signals to a column read/write module 560 and a row select module 570 to select one or more memory cells 590 in the array.

During a write operation, the control module 522 instructs the row/column select module 550 (and the column and row select modules 560 and 570) to select write target cells for the write procedure. The target cells may include any number of cells, such as a particular cell, a row of cells, a column of cells, a block of cells, etc. Once the target cells are selected, the control module 522 instructs the write module 526 to generate a write signal having a first parameter. The write target cells are written to using the first parameter. The first parameter may be a default value for the initial write process. Alternately, the first parameter may be stored in a write profile module 536 and may be unique for each cell, and group of cells, etc. Once the write target cells have been written, additional target cells may be identified and written.

The estimation module 537 compares read back values for the target cells and may generate a second write parameter based on the first write parameter and the comparison. The second write parameter may be stored in the write profile module 536. The read back value may be compared with a predetermined threshold. The second write parameter may be determined based upon the first write parameter, the read back values and/or the comparison. The write and read process may be repeated as necessary.

The write process may include heating the phase change memory cells to a melting temperature and quickly cooling the phase change memory cells based on the first parameter. The first parameter may include current pulse width, current amplitude or rate of current decrease.

The estimation module 537 determines the extent to which the read back value matches a predetermined threshold. When the control module 522 finds the cell resistance within an acceptable threshold of the optimal target value, the first write parameter is used. If outside of an acceptable threshold, the estimation module 537 generates the second write parameter and/or a target write parameter using any suitable method. For example, interpolation and/or extrapolation may be used.

During a read operation, the control module 522 instructs the row/column select module 550 to select read target cells for the read procedure. The read target cells may include any number of cells, such as a particular cell, a row of cells, a column of cells, a block of cells, etc. Once the read target cells are selected, the control module 522 instructs the read module 524 to generate a read signal. A sensing module 532 in the read module 524 senses the stored value in the target cells. The sensing module 532 may include one or more amplifiers 533. In some implementations, the amplifiers 533 may have a logarithmic transfer function as will be described further below.

Referring now to FIGS. 17A-17G, various exemplary implementations incorporating the teachings of the present disclosure are shown.

Figure 17A:
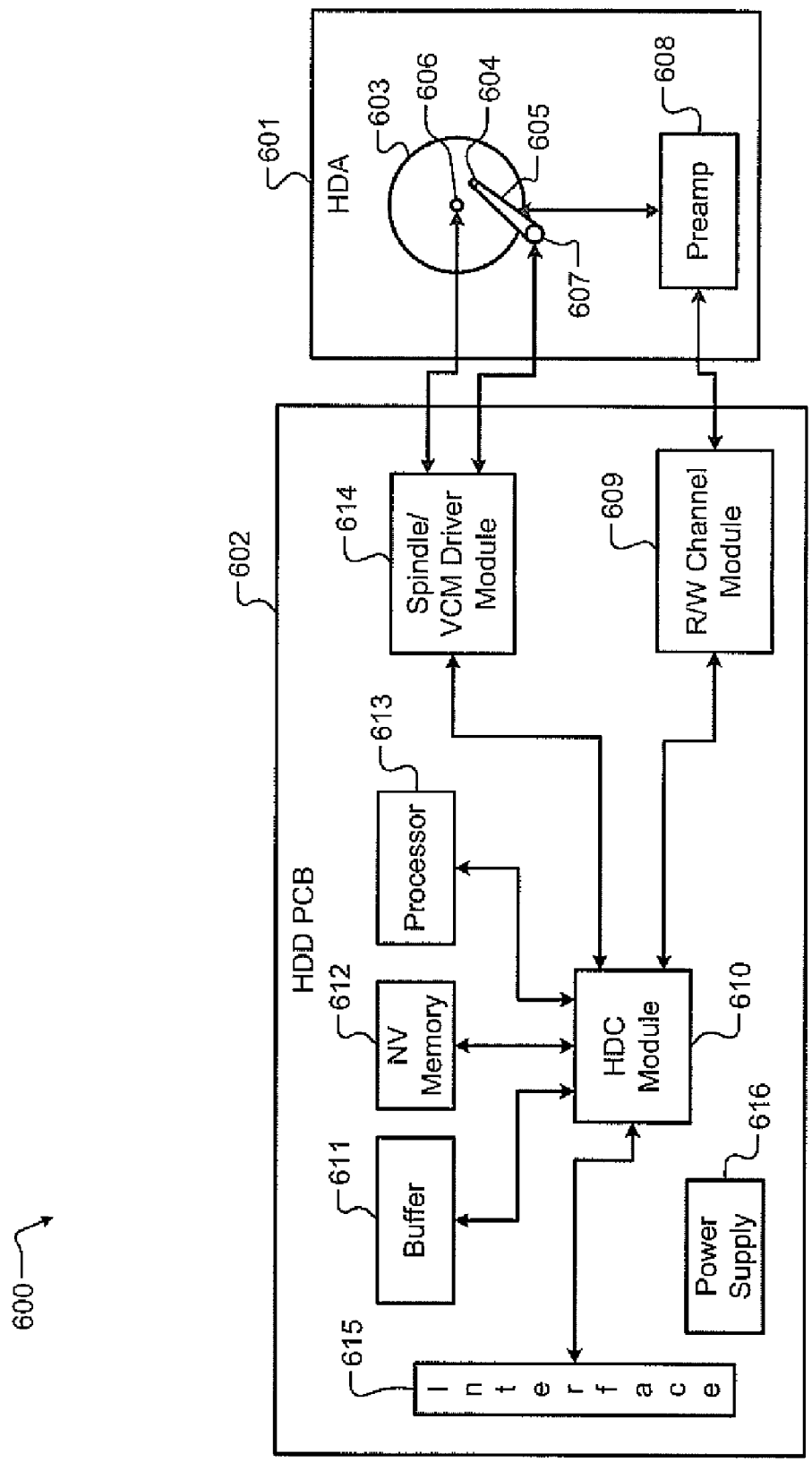
FIG. 17A is a functional block diagram of a hard disk drive.

Referring now to FIG. 17A, the teachings of the disclosure can be implemented in association with a non-volatile memory, such as a non-volatile memory 612, of a hard disk drive (HDD) 600. The HDD 600 includes a hard disk assembly (HDA) 601 and an HDD printed circuit board (PCB) 602. The HDA 601 may include a magnetic medium 603, such as one or more platters that store data, and a read/write device 604. The read/write device 604 may be arranged on an actuator arm 605 and may read and write data on the magnetic medium 603. Additionally, the HDA 601 includes a spindle motor 606 that rotates the magnetic medium 603 and a voice-coil motor (VCM) 607 that actuates the actuator arm 605. A preamplifier device 608 amplifies signals generated by the read/write device 604 during read operations and provides signals to the read/write device 604 during write operations.

The HDD PCB 602 includes a read/write channel module (hereinafter, "read channel") 609, a hard disk controller (HDC) module 610, a buffer 611, the nonvolatile memory 612, a processor 613, and a spindle/VCM driver module 614. The read channel 609 processes data received from and transmitted to the preamplifier device 608. The HDC module 610 controls components of the HDA 601 and communicates with an external device (not shown) via an I/O interface 615. The external device may include a computer, a multimedia device, a mobile computing device, etc. The I/O interface 615 may include wireline and/or wireless communication links.

The HDC module 610 may receive data from the HDA 601, the read channel 609, the buffer 611, nonvolatile memory 612, the processor 613, the spindle/VCM driver module 614, and/or the I/O interface 615. The processor 613 may process the data, including encoding, decoding, filtering, and/or formatting. The processed data may be output to the HDA 601, the read channel 609, the buffer 611, nonvolatile memory 612, the processor 613, the spindle/VCM driver module 614, and/or the I/O interface 615.

The HDC module 610 may use the buffer 611 and/or nonvolatile memory 612 to store data related to the control and operation of the HDD 600. The buffer 611 may include DRAM, SDRAM, etc. Nonvolatile memory 612 may include any suitable type of semiconductor or solid-state memory, such as flash memory (including NAND and NOR flash memory), programmable read only memory (PROM), phase change memory, magnetic RAM, and multi-state memory, in which each memory cell has more than two states. The spindle/VCM driver module 614 controls the spindle motor 606 and the VCM 607. The HDD PCB 602 includes a power supply 616 that provides power to the components of the HDD 600.

Figure 17B:
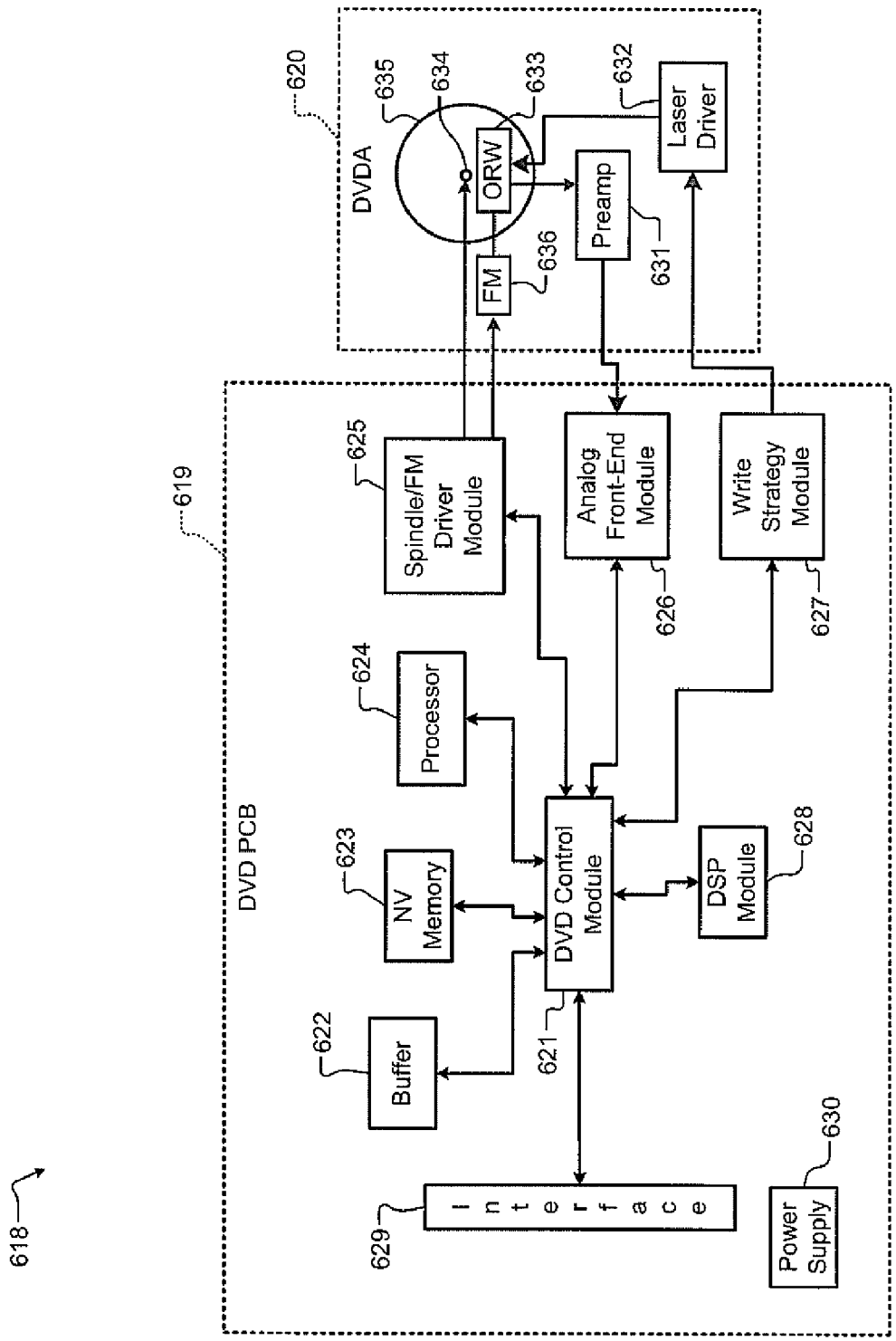
FIG. 17B is a functional block diagram of a DVD drive.

Referring now to FIG. 17B, the teachings of the disclosure can be implemented in association with a non-volatile memory, such as a non-volatile memory 623, of a DVD drive 618 or of a CD drive (not shown). The DVD drive 618 includes a DVD PCB 619 and a DVD assembly (DVDA) 620. The DVD PCB 619 includes a DVD control module 621, a buffer 622, the nonvolatile memory 623, a processor 624, a spindle/FM (feed motor) driver module 625, an analog front-end module 626, a write strategy module 627, and a DSP module 628.

The DVD control module 621 controls components of the DVDA 620 and communicates with an external device (not shown) via an I/O interface 629. The external device may include a computer, a multimedia device, a mobile computing device, etc. The I/O interface 629 may include wireline and/or wireless communication links.

The DVD control module 621 may receive data from the buffer 622, nonvolatile memory 623, the processor 624, the spindle/FM driver module 625, the analog front-end module 626, the write strategy module 627, the DSP module 628, and/or the I/O interface 629. The processor 624 may process the data, including encoding, decoding, filtering, and/or formatting. The DSP module 628 performs signal processing, such as video and/or audio coding/decoding. The processed data may be output to the buffer 622, nonvolatile memory 623, the processor 624, the spindle/FM driver module 625, the analog front-end module 626, the write strategy module 627, the DSP module 628, and/or the I/O interface 629.

The DVD control module 621 may use the buffer 622 and/or nonvolatile memory 623 to store data related to the control and operation of the DVD drive 618. The buffer 622 may include DRAM, SDRAM, etc. Nonvolatile memory 623 may include any suitable type of semiconductor or solid-state memory, such as flash memory (including NAND and NOR flash memory), programmable read only memory (PROM), phase change memory, magnetic RAM, and multi-state memory, in which each memory cell has more than two states. The DVD PCB 619 includes a power supply 630 that provides power to the components of the DVD drive 618.

The DVDA 620 may include a preamplifier device 631, a laser driver 632, and an optical device 633, which may be an optical read/write (ORW) device or an optical read-only (OR) device. A spindle motor 634 rotates an optical storage medium 635, and a feed motor 636 actuates the optical device 633 relative to the optical storage medium 635.

When reading data from the optical storage medium 635, the laser driver provides a read power to the optical device 633. The optical device 633 detects data from the optical storage medium 635, and transmits the data to the preamplifier device 631. The analog front-end module 626 receives data from the preamplifier device 631 and performs such functions as filtering and A/D conversion. To write to the optical storage medium 635, the write strategy module 627 transmits power level and timing data to the laser driver 632. The laser driver 632 controls the optical device 633 to write data to the optical storage medium 635.

Figure 17D:
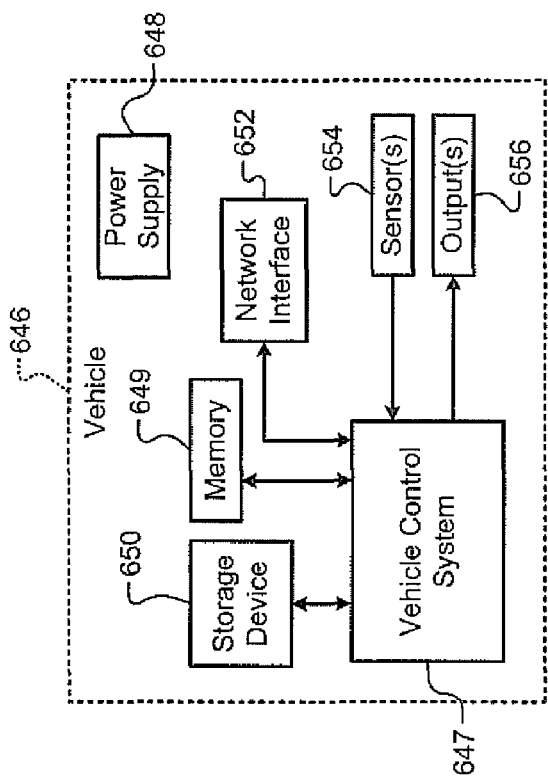
FIG. 17D is a functional block diagram of a vehicle control system.
Figure 17C:
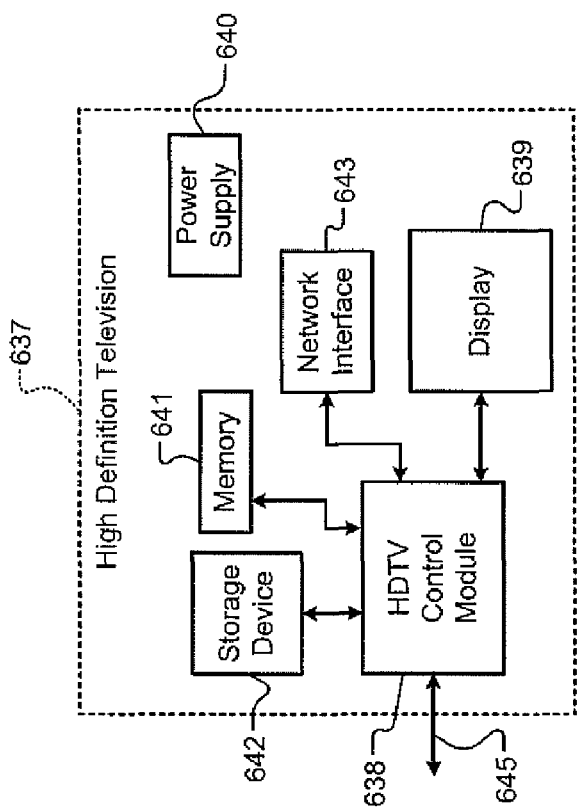
FIG. 17C is a functional block diagram of a high definition television.

Referring now to FIG. 17C, the teachings of the disclosure can be implemented in association with a non-volatile memory, such as a memory 641, of a high definition television (HDTV) 637. The HDTV 637 includes an HDTV control module 638, a display 639, a power supply 640, the memory 641, a storage device 642, a network interface 643, and an external interface 645. If the network interface 643 includes a wireless local area network interface, an antenna (not shown) may be included.

The HDTV 637 can receive input signals from the network interface 643 and/or the external interface 645, which can send and receive data via cable, broadband Internet, and/or satellite. The HDTV control module 638 may process the input signals, including encoding, decoding, filtering, and/or formatting, and generate output signals. The output signals may be communicated to one or more of the display 639, memory 641, the storage device 642, the network interface 643, and the external interface 645.

Memory 641 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 642 may include an optical storage drive, such as a DVD drive, and/or a hard disk drive (HDD). The HDTV control module 638 communicates externally via the network interface 643 and/or the external interface 645. The power supply 640 provides power to the components of the HDTV 637.

Referring now to FIG. 17D, the teachings of the disclosure may be implemented in association with a non-volatile memory, such as a non-volatile memory 649, of a vehicle 646. The vehicle 646 may include a vehicle control system 647, a power supply 648, the memory 649, a storage device 650, and a network interface 652. If the network interface 652 includes a wireless local area network interface, an antenna (not shown) may be included. The vehicle control system 647 may be a powertrain control system, a body control system, an entertainment control system, an anti-lock braking system (ABS), a navigation system, a telematics system, a lane departure system, an adaptive cruise control system, etc.

The vehicle control system 647 may communicate with one or more sensors 654 and generate one or more output signals 656. The sensors 654 may include temperature sensors, acceleration sensors, pressure sensors, rotational sensors, airflow sensors, etc. The output signals 656 may control engine operating parameters, transmission operating parameters, suspension parameters, etc.

The power supply 648 provides power to the components of the vehicle 646. The vehicle control system 647 may store data in memory 649 and/or the storage device 650. Memory 649 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 650 may include an optical storage drive, such as a DVD drive, and/or a hard disk drive (HDD). The vehicle control system 647 may communicate externally using the network interface 652.

Figure 17F:
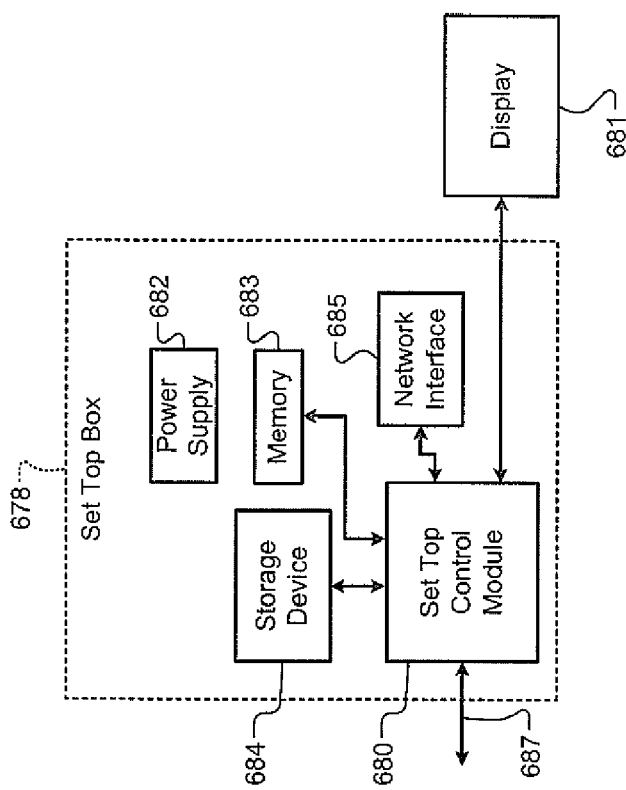
FIG. 17F is a functional block diagram of a set top box.
Figure 17E:
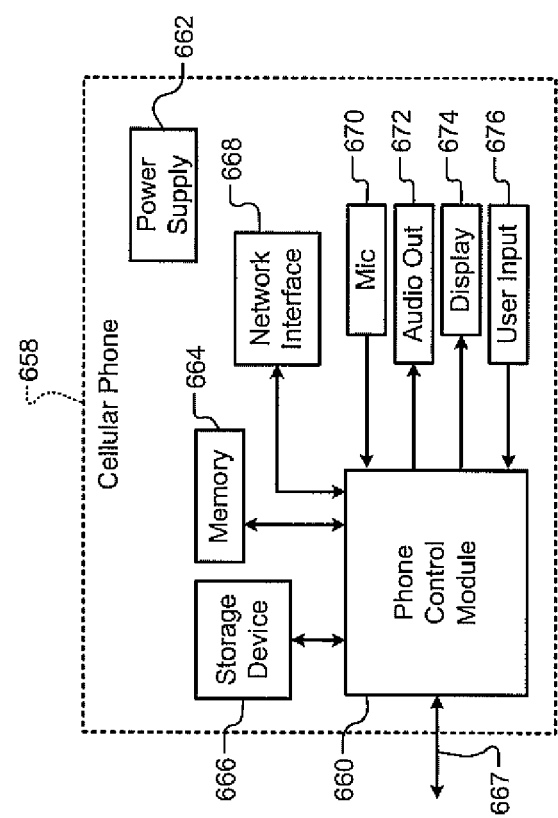
FIG. 17E is a functional block diagram of a cellular phone.

Referring now to FIG. 17E, the teachings of the disclosure can be implemented in association with a non-volatile memory, such as a non-volatile memory 664, of a cellular phone 658. The cellular phone 658 includes a phone control module 660, a power supply 662, the memory 664, a storage device 666, and a cellular network interface 667. The cellular phone 658 may include a network interface 668, a microphone 670, an audio output 672, such as a speaker and/or output jack, a display 674, and a user input device 676 such as a keypad and/or pointing device. If the network interface 668 includes a wireless local area network interface, an antenna (not shown) may be included.

The phone control module 660 may receive input signals from the cellular network interface 667, the network interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the network interface 668, and the audio output 672.

Memory 664 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 666 may include an optical storage drive, such as a DVD drive, and/or a hard disk drive (HDD). The power supply 662 provides power to the components of the cellular phone 658.

Referring now to FIG. 17F, the teachings of the disclosure can be implemented in association with a non-volatile memory, such as a non-volatile memory 683, of a set top box 678. The set top box 678 includes a set top control module 680, a display 681, a power supply 682, the memory 683, a storage device 684, and a network interface 685. If the network interface 685 includes a wireless local area network interface, an antenna (not shown) may be included.

The set top control module 680 may receive input signals from the network interface 685 and an external interface 687, which can send and receive data via cable, broadband Internet, and/or satellite. The set top control module 680 may process signals, including encoding, decoding, filtering, and/or formatting, and generate output signals. The output signals may include audio and/or video signals in standard and/or high definition formats. The output signals may be communicated to the network interface 685 and/or to the display 681. The display 681 may include a television, a projector, and/or a monitor.

The power supply 682 provides power to the components of the set top box 678. Memory 683 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 684 may include an optical storage drive, such as a DVD drive, and/or a hard disk drive (HDD).

Figure 17G:
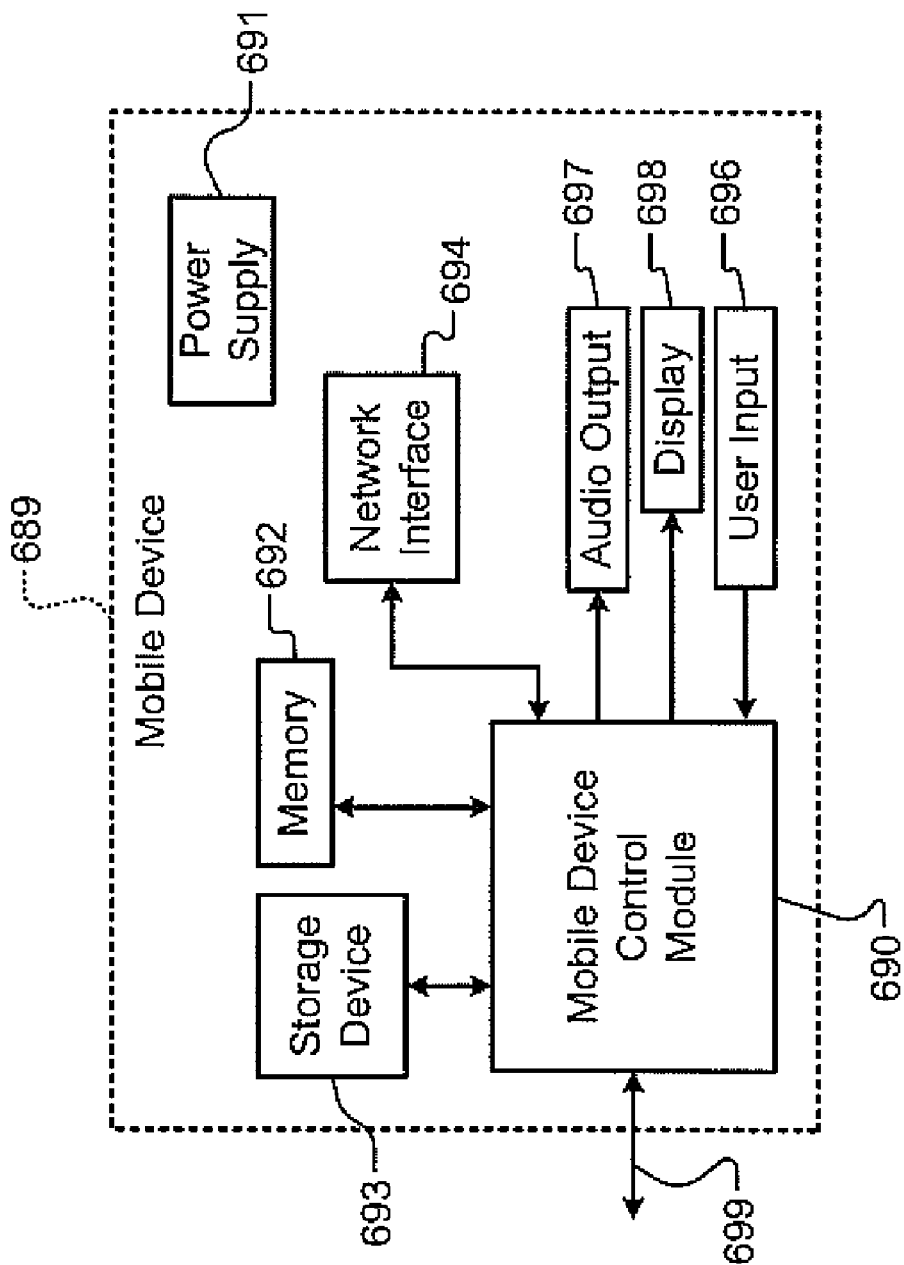
FIG. 17G is a functional block diagram of a mobile device.

Referring now to FIG. 17G, the teachings of the disclosure can be implemented in association with a non-volatile memory, such as a non-volatile memory 692, of a mobile device 689. The mobile device 689 may include a mobile device control module 690, a power supply 691, the memory 692, a storage device 693, a network interface 694, and an external interface 699. If the network interface 694 includes a wireless local area network interface, an antenna (not shown) may be included.

The mobile device control module 690 may receive input signals from the network interface 694 and/or the external interface 699. The external interface 699 may include USB, infrared, and/or Ethernet. The input signals may include compressed audio and/or video, and may be compliant with the MP3 format. Additionally, the mobile device control module 690 may receive input from a user input 696 such as a keypad, touchpad, or individual buttons. The mobile device control module 690 may process input signals, including encoding, decoding, filtering, and/or formatting, and generate output signals.

The mobile device control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory comprising:
   a plurality of base layers including plurality of switches;
   a phase-change material layer;
   a bit line layer arranged between and coupled to the plurality of base layers and the phase-change material layer;
   a word line layer arranged between and coupled to the plurality of base layers and the phase-change material layer; and
   a voltage source layer comprising a plurality of independent voltage source segments, wherein the plurality of independent voltage source segments are in communication with the plurality of switches.

2. The memory of claim 1, wherein:
   the bit line layer is arranged directly adjacent to the plurality of base layers, and
   the word line layer is arranged directly adjacent to the bit line layer.

3. The memory of claim 1, wherein the phase-change layer has a plurality of amorphous states and a plurality of crystalline states.

4. The memory of claim 1, wherein the phase-change layer has a unified section that is associated with the plurality of switches.

5. The memory of claim 1, wherein:
   the phase-change layer has a plurality of independent sections, and
   each of the independent sections of the phase change layer is associated with at least two of the plurality of switches.

6. The memory of claim 1, wherein the phase change layer comprises a plurality of localized portions configured to perform as individual phase-change elements.

7. The memory of claim 1, wherein the plurality of voltage source segments are coupled to the plurality of switches.

8. The memory of claim 1, wherein the plurality of voltage source segments are coupled to the phase change layer.

9. The memory of claim 1, wherein each of the plurality of voltage source segments receives a different voltage relative to another voltage source segment.

10. The memory of claim 1, wherein one of the voltage source segments is coupled to a plurality of independent sections of the phase-change material layer.

11. The memory of claim 1, wherein one of a plurality of independent sections of the phase-change material layer is coupled to a plurality of the voltage source segments.

12. The memory of claim 1, further comprising a power switch coupled to the voltage source segments, the power switch configured to select one of a plurality of source voltages.

13. The memory of claim 1, further comprising a plurality of power switches each coupled to one of the voltage source segments, the plurality of power switches configured to select one of a plurality of source voltages.

14. The memory of claim 1, wherein the plurality of switches comprises one or more of: three terminal switches, metal-oxide-semiconductor field-effect transistors, or bipolar junction transistors.

* * * * *